(12) United States Patent
Takechi et al.

(10) Patent No.: US 6,566,174 B1
(45) Date of Patent: May 20, 2003

(54) THIN-FILM TRANSISTOR ELEMENTS AND METHODS OF MAKING SAME

(75) Inventors: Kazushige Takechi, Tokyo (JP); Naoto Hirano, Tokyo (JP)

(73) Assignee: Nec Corporation, Tokyo (JP)

( * ) Notice: Subject to any disclaimer, the term of this patent is extended or adjusted under 35 U.S.C. 154(b) by 273 days.

(21) Appl. No.: 09/656,370

(22) Filed: Sep. 6, 2000

Related U.S. Application Data

(62) Division of application No. 09/064,052, filed on Apr. 22, 1998, now Pat. No. 6,429,456.

(30) Foreign Application Priority Data

Apr. 23, 1997 (JP) .............................................. 9-105863
Nov. 5, 1997 (JP) .............................................. 9-302920

(51) Int. Cl.[7] .............................................. H01L 21/84
(52) U.S. Cl. .................................... 438/149; 438/161
(58) Field of Search ................. 438/149, 161, 438/165, 166

(56) References Cited

U.S. PATENT DOCUMENTS

| | | |
|---|---|---|
| 4,720,736 A | 1/1988 | Takafuji et al. |
| 4,924,282 A | 5/1990 | Komiyama et al. |
| 5,032,883 A | 7/1991 | Wakai et al. |
| 5,144,391 A | 9/1992 | Iwata et al. |
| 5,554,547 A * | 9/1996 | Ha .............................. 438/30 |
| 5,834,797 A | 11/1998 | Yamanaka |
| 5,920,082 A | 7/1999 | Kitazawa et al. |
| 5,962,896 A | 10/1999 | Yabuta et al. |
| 5,998,229 A * | 12/1999 | Lyu et al. ...................... 438/30 |

FOREIGN PATENT DOCUMENTS

| | | | |
|---|---|---|---|
| JP | 58021868 A | * | 2/1983 |
| JP | S64-49272 | | 2/1989 |
| JP | H1-207930 | | 8/1989 |
| JP | H1-302769 | | 12/1989 |
| JP | 3-174517 | | 7/1991 |
| JP | 4-11254 | | 4/1992 |
| JP | H4-218926 | | 8/1992 |
| JP | 4-234134 | | 8/1992 |
| JP | 4-275437 | | 10/1992 |
| JP | H4-302438 | | 10/1992 |
| JP | 5-63197 | | 3/1993 |
| JP | 5-165056 | | 6/1993 |
| JP | 5-211334 | | 8/1993 |
| JP | 5-283692 | | 10/1993 |
| JP | 6-77483 | | 3/1994 |
| JP | H6-175156 | | 6/1994 |
| JP | 6-267906 | | 9/1994 |
| JP | H7-84284 | | 3/1995 |
| JP | H7-131023 | | 5/1995 |
| JP | H7-221085 | | 8/1995 |
| JP | H7-318979 | | 12/1995 |
| JP | H8-242000 | | 9/1996 |

* cited by examiner

*Primary Examiner*—Caridad Everhart
(74) *Attorney, Agent, or Firm*—Sughrue Mion, PLLC

(57) ABSTRACT

This invention provides an inverted staggered type thin-film transistor element wherein the n-doped amorphous silicon film (14) present in the region where the amorphous silicon film (13) does not overlap with the source-drain electrodes (15) is modified into an insulating film (17) by exposure to a plasma containing ions or radicals of oxygen and/or nitrogen, so that the undesired n-doped amorphous silicon film above a channel region need not be removed and the amorphous silicon film can be made thinner. Moreover, the aperture ratio of a liquid crystal display can be enhanced by utilizing such elements.

8 Claims, 16 Drawing Sheets

THIN-FILM TRANSISTOR ELEMENTS AND METHODS OF MAKING SAME

This is a divisional of application Ser. No. 09/064,052 filed Apr. 22, 1998 now U.S. Pat. No. 6,429,456, the disclosure of which is incorporated herein by reference.

BACKGROUND OF THE INVENTION

1. Field of the Invention

This invention relates to thin-film transistor elements and methods of making the same. More particularly, it relates to thin-film transistor element structures used in active matrix type liquid crystal displays, and methods of making the same.

2. Description of the Related Art

In recent years, active matrix type liquid crystal displays in which thin-film transistors (TFTs) using a hydrogenated amorphous silicon film are utilized as switching elements for display picture elements are being produced in large quantities. Especially with the popularization of notebook type personal computers, the demand for liquid crystal displays is growing rapidly and, therefore, an improvement in their productivity is being needed.

Referring to FIG. 17, there is shown a sectional view of an inverted staggered type thin-layer transistor element which is commonly used as a switching element for each picture element of a liquid crystal display. First of all, a metal for use as a gate electrode is deposited on a transparent insulating substrate 10, and patterned into a desired shape to form a gate electrode 11. Then, a silicon nitride film 12 serving as a gate insulating film, an amorphous silicon film 13, and an n-doped amorphous silicon film 14 for making ohmic contacts of source-drain regions are successively formed thereon, and n-doped amorphous silicon film 14 and amorphous silicon film 13 are patterned into an island-like shape. Subsequently, a metal for use as source-drain electrodes is deposited and patterned into desired shapes to form source-drain electrodes 15. Finally, the undesired n-doped amorphous silicon film 14 above the channel is etched together with a part of amorphous silicon film 13 in consideration of a margin. Thus, a thin-film transistor element as illustrated in FIG. 17 is completed.

As an inverted staggered type thin-film transistor element of this type, Japanese Patent Publication No. 51069/'92 has proposed a thin-film transistor in which an n-doped amorphous silicon film is formed so as to cover the whole surface of the island-like amorphous silicon film and so as to impart an off resistance of not less than $10^9$ $\Omega$ to the thin-film transistor (i.e., the n-doped amorphous silicon film above the channel is not removed). However, in order to obtain good ohmic contact characteristics, the n-doped amorphous silicon film must have a resistivity of not greater than $10^4$ $\Omega$cm. Moreover, in order to achieve an off resistance of not less than $10^9$ $\Omega$ for a typical thin-film transistor element size as represented by a (channel width)/(channel length) ratio of 10, the thickness of the n-doped amorphous silicon film must be limited to 10 nm or less even if the resistivity thereof is not greater than $10^4$ $\Omega$cm. Where it is desired to achieve a satisfactory panel representation by using thin-film transistor elements as driving elements for the picture elements of a liquid crystal display, an off resistance of about $10^{10}$ to $10^{11}$ $\Omega$ is actually required. In order to obtain such an off resistance, the n-doped amorphous silicon film must have a thickness of about 0.1 to 1 nm. However, such a very thin n-doped amorphous silicon film involved a problem in that it fails to give good ohmic contact characteristics and hence causes a marked reduction in on-state current.

Moreover, in recent years, technical developments are being made to improve the aperture ratio of each picture element section of a liquid crystal display by using, as protective insulating films, insulating films formed by applying and thermally curing various polymeric materials. In these applied insulating films, a film thickness of about 2 to 3 $\mu$m can be easily obtained, and their relative permittivities are equal to about ½ of that of a conventionally used silicon nitride film. Accordingly, even if the transparent conductive picture element electrodes formed on such an applied insulating film overlap with the data lines and the signal lines, the coupling capacity due to such overlap is very low and, therefore, display defects such as crosstalk are minimized. Thus, it becomes possible to achieve a high aperture ratio while maintaining satisfactory display characteristics. In this respect, an explanation is given below with reference to FIG. 18.

A metal for use as a gate electrode is deposited on a transparent insulating substrate 10, and patterned into a desired shape to form a gate electrode 11. Then, a silicon nitride film 12 serving as a gate insulating film, an amorphous silicon film 13, and an n-doped amorphous silicon film 14 for making ohmic contacts of source-drain regions are successively formed thereon, and n-doped amorphous silicon film 14 and amorphous silicon film 13 are patterned into a desired island-like shape. Subsequently, a metal for use as source-drain electrodes is deposited and patterned into desired shapes to form source-drain electrodes 15. Moreover, the undesired n-doped amorphous silicon film 14 above the channel is etched together with a part of amorphous silicon film 13 in consideration of a margin. Thereafter, a protective insulating film (or applied insulating film) 18 is formed over the whole surface. Finally, a transparent conductive picture element electrode 19 is formed so that it is electrically connected to the source electrode through a contact hole. Thus, a thin-film transistor element is completed. This technique has been reported, for example, by Y. Takafuji et al. [SID '93, Digest, p. 383 (1993)] and Jeong Hyun Kim et al. [AM-LCD 96, Digest, p. 149 (1996)].

At present, in order to reduce the prices of liquid crystal displays, it is strongly desired to simplify the thin-film transistor fabrication process and achieve an improvement in the throughput thereof. In particular, inverted staggered type thin-film transistor elements as described above are most widely utilized in liquid crystal displays because of their excellent element characteristics and stability, and a simplification of their fabrication process and an improvement in the throughput thereof are believed to contribute greatly to a reduction in the prices of liquid crystal displays. As described above, in the case of conventional inverted staggered type thin-film transistor elements, it is necessary to etch the undesired n-doped amorphous silicon film above the channel during the fabrication process thereof. To this end, it is difficult to etch the n-doped amorphous silicon film selectively at a high selectivity ratio to the underlying amorphous silicon film. Accordingly, the n-doped amorphous silicon film has been etched together with a part of the underlying amorphous silicon film in consideration of a margin.

However, the amorphous silicon film surface, i.e., back channel interface, having been exposed to an etching gas is severely affected by process damage and hence has a very high surface state density due to defects. Consequently, if the thickness of the amorphous silicon film in the channel region is decreased to about 150 nm or less after etching, the on-state characteristics of the thin-film transistor element will be significantly reduced under the influence of the surface state on the back channel side. For theses reasons, it has been necessary to form an amorphous silicon film having a thickness of as large as about 300 nm.

As described above, conventional inverted staggered type thin-film transistor elements have involved the following two important problems:

(1) It is necessary to etch the undesired n-doped amorphous silicon film above the channel together with a part of the underlying amorphous silicon film in consideration of a margin.

(2) In order to obtain good on-state characteristics, the amorphous silicon film must be thick.

It is believed that these problems raise the costs of liquid crystal displays for the following reasons:

As to the above problem (1), there is only a slight difference in etching selectivity between the n-doped amorphous silicon film and the amorphous silicon film, so that the amount of etching tends to vary in the panel. Consequently, the on-state characteristics of thin-film transistor elements are reduced in the regions where the amount of etching is greater (i.e., the regions where the amorphous silicon film constituting the channel has become thinner after etching). This causes an image to be unevenly displayed on the panel, resulting in a low yield of products.

As to the above problem (2), the plasma CVD process for forming an amorphous silicon film and the dry etching process for patterning it into an island-like shape cause a reduction in throughput and hence a rise in cost. Moreover, if the amorphous silicon film having high photosensitivity is thick, the off-state photocurrent of the thin-film transistor element will be increased, resulting in a reduction in holding characteristics. This may also cause an image to be unevenly displayed on the panel.

For these reasons, it is needed to develop, for use with inverted staggered type thin-film transistor elements, a device technique which makes it unnecessary to etch the undesired n-doped amorphous silicon above the channel and permits the amorphous silicon film to be made thinner.

Furthermore, the convention structure for achieving a high aperture ratio has involved a problem concerning the long-term reliability and stability of transistor characteristics in that, since the amorphous silicon film constituting the active layer of the thin-film transistor and the applied insulating film come into direct contact at the back channel interface, moisture and mobile ions present in the applied insulating film (their contents are generally much higher than those in a silicon nitride film formed by a plasma CVD process) affect the back channel characteristics of the transistor. This may also cause an image to be unevenly displayed on the liquid crystal display. In order to minimize this problem, it has been conventional practice to use a channel protection type thin-film transistor element (having an inverted staggered type structure in which the back channel interface is coated with a silicon nitride film in advance), or stabilize the back channel interface characteristics by forming a silicon nitride film on the back channel interface of the amorphous silicon film from which the n-doped amorphous silicon film has been removed, as a pretreatment step preceding the formation of an applied insulating film, and thereafter forming the applied insulating film thereon. However, these measures increase the number of plasma CVD film-forming steps and patterning steps and hence causes a rise in cost.

SUMMARY OF THE INVENTION

It is an object of the present invention to provide a device technique which makes it possible to make thin-film transistor elements having stable characteristics even if an applied insulating film is used and to achieve a high aperture ratio in liquid crystal displays.

In order to solve the above-described problems, the present invention provides:

an inverted staggered type thin-film transistor element comprising a transparent insulting substrate having thereon at least a gate electrode, a gate insulating film, an island-like amorphous silicon film, source-drain electrodes, and an n-doped amorphous silicon film formed as an intermediate layer in the regions where the island-like amorphous silicon film overlaps with the source-drain electrodes, wherein the thin-film transistor element has an insulating film obtained by forming an n-doped amorphous silicon film tentatively in the region where the island-like amorphous silicon film does not overlap with the source-drain electrodes, and modifying the so-formed n-doped amorphous silicon film by a plasma treatment; and an inverted staggered type thin-film transistor element comprising a transparent insulting substrate having thereon at least a gate electrode, a gate insulating film, an island-like amorphous silicon film, source-drain electrodes, and an n-doped amorphous silicon film formed as an intermediate layer in the regions where the island-like amorphous silicon film overlaps with the source-drain electrodes, wherein the thin-film transistor element is made by forming an n-doped amorphous silicon film tentatively in the region where the island-like amorphous silicon film does not overlap with the source-drain electrodes, modifying the so-formed n-doped amorphous silicon film into an insulating film by a plasma treatment, and removing the resulting insulating film with the aid of a solution containing hydrofluoric acid.

By applying the present invention to inverted staggered type thin-film transistor elements, it becomes unnecessary to etch the undesired n-doped amorphous silicon film above the channel together with a part of the underlying amorphous silicon film in consideration of a margin, and it becomes possible to make the amorphous silicon film thinner while maintaining excellent characteristics.

Especially when the n-doped amorphous silicon film is not etched but modified into an insulating film by a plasma treatment, a good and stable back channel interface having a low defect density can be created. Moreover, the resulting insulating film can readily be removed with the aid of a solution containing hydrofluoric acid. This is effective in terminating the dangling bonds of silicon present at the back channel interface with hydrogen atom in hydrofluoric acid and thereby achieving a further reduction in defect density.

Furthermore, the use of thin-film transistor elements in accordance with the present invention make it possible to achieve a high aperture ratio in liquid crystal displays while maintaining stabler characteristics than those of conventional thin-film transistor elements, and without increasing the number of process steps. The reasons for this are that an applied insulating film formed from a polymeric material and having a low relative permittivity may be used as a protective insulating film and picture element electrodes may be formed thereon so as to overlap with the signal lines and the data lines, and that an insulating film formed by modification based on a plasma treatment is present between the applied insulating film and the amorphous silicon film and this functions as a protective film for securing the stability of thin-film transistor element characteristics. Especially when a thermosetting resin is used as the polymeric material for the formation of an applied insulating film, a marked reduction in cost can be expected for such reasons as a low material cost.

Thus, the present invention makes it possible to achieve a high aperture ratio in liquid crystal displays while securing desirable thin-film transistor elements characteristics and, moreover, to reduce the manufacturing costs of such high-performance liquid crystal displays.

The above and other objects, features and advantages of the present invention will become apparent from the following description with reference to the accompanying drawings which illustrate examples of the present invention.

DESCRIPTION OF THE PREFERRED EMBODIMENTS

The key point in making the thin-film transistor element of the present invention lies in the fact that the undesired n-doped amorphous silicon film present in the region where the amorphous silicon film does not overlap with the source-drain electrodes is modified into an insulating film by a plasma treatment. As a result, the surface of the amorphous silicon film (i.e., the back channel interface) is not directly exposed to air, plasma or the like and hence suffers no damage. Accordingly, the surface state of the back channel is reduced and the amorphous silicon film can be made thinner.

Moreover, in order to achieve a high aperture ratio in liquid crystal displays, the present invention also provides a thin-film transistor element characterized in that, in addition to having the above-described features, the thin-film transistor element has a protective insulating film for protecting the whole element, a transparent conductive electrode formed on this protective insulating film is connected to the source electrode through a contact hole, and the protective insulating film is an applied insulating film formed by use of a solution prepared by dissolving a polymeric material (e.g., a high-molecular siloxane compound or a high-molecular polysilazane compound) in a solvent.

Now, the present invention is described below in greater detail.

Figure 1:
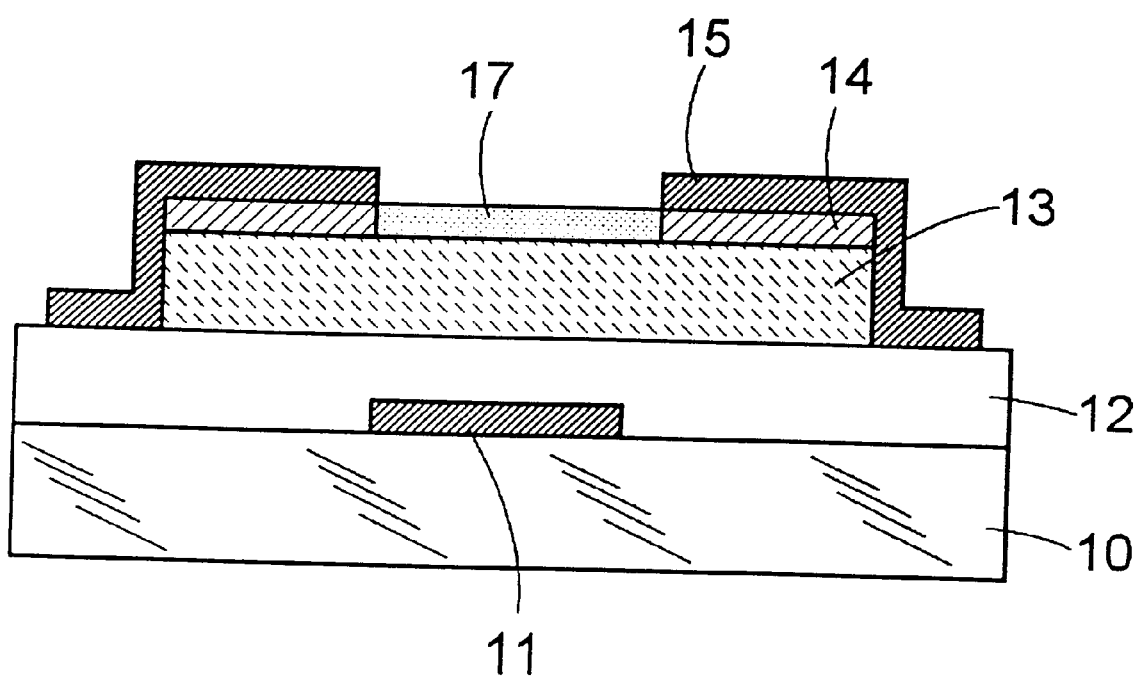
FIG. 1 is a schematic sectional view for explaining one embodiment of the thin-film transistor element of the present invention.

As illustrated in FIG. 1, the thin-film transistor element of the present invention is an inverted staggered type thin-film transistor element comprising a transparent insulating substrate 10 (e.g., a glass substrate) having thereon a gate electrode 11, a gate insulating film 12, an island-like amorphous silicon film 13, source-drain electrodes 15, and an n-doped amorphous silicon film 14 formed as an intermediate layer in the regions where island-like amorphous silicon film 13 overlaps with source-drain electrodes 15, and having a structure in which the aforesaid n-doped amorphous silicon film 14 is formed on the opposite side of island-like amorphous silicon film 13 to gate electrode 11. The aforesaid n-doped amorphous silicon film 14 is tentatively formed on island-like amorphous silicon film 13, inclusive of the region where island-like amorphous silicon film 13 does not overlap with source-drain electrodes 15 (i.e., the region above the channel). Thereafter, only n-doped amorphous silicon film 14 above the channel is exposed to a plasma such as an oxygen plasma, nitrogen plasma or mixed oxygen-nitrogen plasma, and thereby modified into an insulating film 17 comprising an oxide film, nitride film or oxide nitride film. Thus, there can be created a state equivalent to the state in which the undesired n-doped amorphous silicon film 14 above the channel is substantially removed. Since n-doped amorphous silicon film 14 (i.e., an amorphous silicon film containing a large amount of an impurity) has a higher rate of oxidation, nitriding, or oxidation and nitriding as compared with amorphous silicon film 13, n-doped amorphous silicon film 14 alone can be selectively modified. Moreover, since the insulating film 17 such as an oxide, nitride or oxide nitride film formed by such modification is quite different in etching properties from the underlying amorphous silicon film 13, it can be easily etched, for example, with a solution containing hydrofluoric acid. Thus, insulating film 17 alone can be selectively removed.

Figure 10:
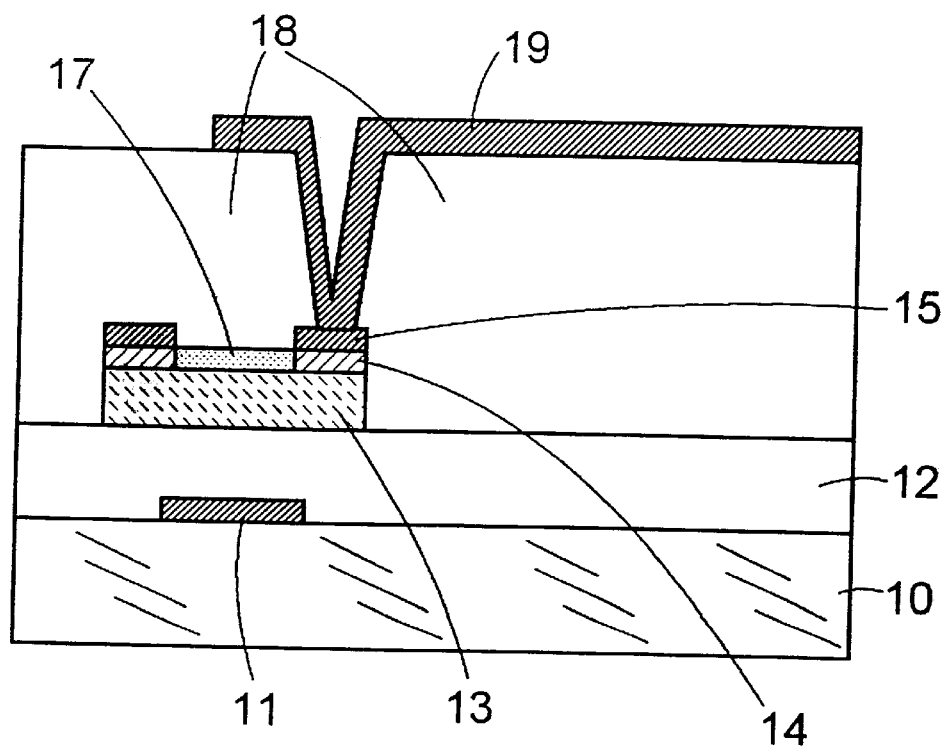
FIG. 10 is a schematic sectional view for explaining one embodiment of the thin-film transistor element for achieving a high aperture ratio in accordance with the present invention.

Furthermore, according to the feature of the present invention for achieving a high aperture ratio in a thin-film transistor element as illustrated in FIG. 1 (i.e., a thin-film transistor element having an insulating film 17 formed by modification based on a plasma treatment), an applied insulating film 18 is used as the protective insulating film for protecting the whole element, as illustrated in FIG. 10. Then, a transparent conductive picture element electrode 19 is formed on applied insulating film 18 and electrically connected to the source electrode through a contact hole.

Figure 2A:
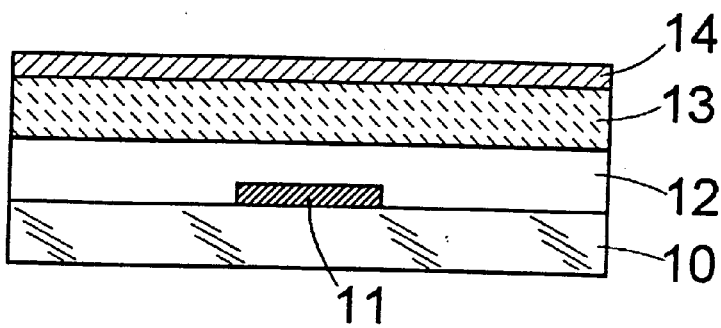
FIGS. 2A to 2D are schematic sectional views for explaining a series of steps in one form of the method of making the thin-film transistor element of the present invention.
Figure 2B:
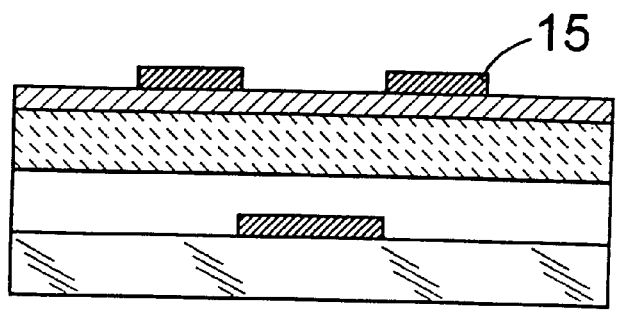
Figure 2C:
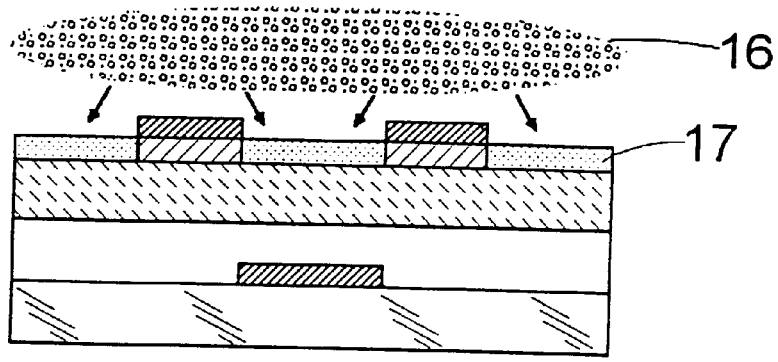
Figure 2D:
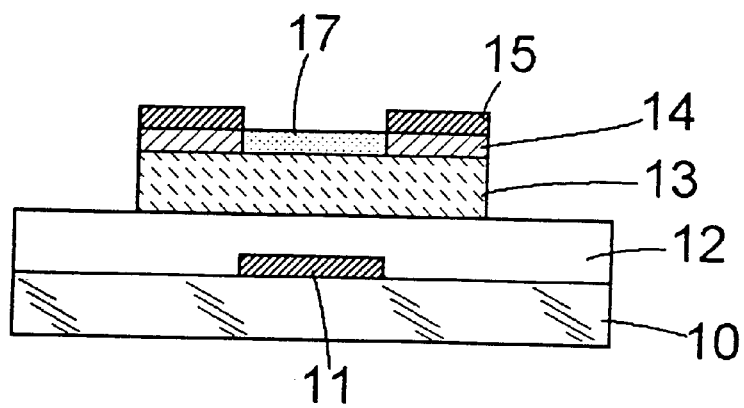

Next, one embodiment of the present invention is described below with reference to FIG. 2. First of all, as illustrated in FIG. 2A, a metal for use as a gate electrode is deposited on a transparent insulating substrate 10 and then patterned into a desired shape to form a gate electrode 11. Thereafter, according to a plasma CVD process or the like, a gate insulating film 12, an amorphous silicon film 13 and an n-doped amorphous silicon film 14 are successively formed. Subsequently, as illustrated in FIG. 2B, a metal for use as source-drain electrodes is deposited by sputtering or the like, and then patterned into desired shapes to form source-drain electrodes 15. Moreover, as illustrated in FIG. 2C, this substrate is exposed to an atmosphere of a plasma containing ions or radicals of oxygen and/or nitrogen. In this step, n-doped amorphous silicon film 14 present on amorphous silicon film 13 in the regions where amorphous silicon film 13 does not overlap with source-drain electrodes 15 is selectively oxidized, nitrided, or oxidized and nitrided, and thereby modified into an insulating film 17 comprising silicon oxide, silicon nitride or silicon oxide nitride containing an n-type impurity. Consequently, this insulating film 17 has substantially the same thickness as n-doped amorphous silicon film 14. In order that all n-doped amorphous silicon film 14 present on amorphous silicon film 13 in the regions where amorphous silicon film 13 does not overlap with source-drain electrodes 15 may be modified into insulating film 17, it is desirable to limit the thickness of n-doped amorphous silicon film 14 to about 15 nm or less. Moreover, in order to obtain good ohmic contact characteristics in n-doped amorphous silicon film 14 having such a small thickness, sufficiently high doping efficiency must be achieved. Accordingly, as one of the plasma CVD conditions employed for the formation of an n-doped amorphous silicon film, it is desirable to supply phosphine gas at a flow rate equal to 10% or more of the flow rate of silane. Under ordinary conditions employed for the formation of an n-doped amorphous silicon film, the flow rate of phosphine gas is as low as about 5% or less of the flow rate of silane. Finally, as illustrated in FIG. 2D, insulating film 17 and amorphous silicon film 13 are patterned into a desired island-like shape to complete a thin-film transistor element.

Figure 3A:
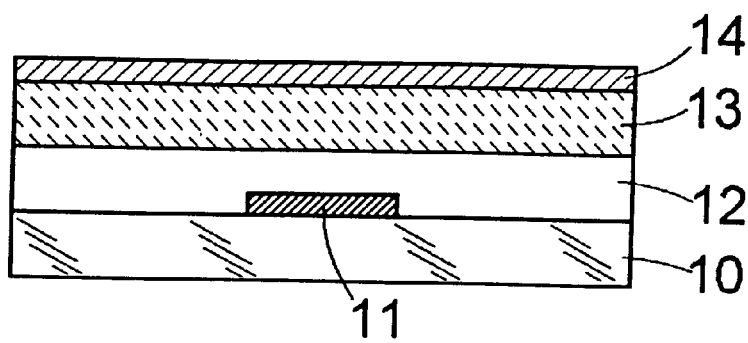
FIGS. 3A to 3D are schematic sectional views for explaining a series of steps in another form of the method of making the thin-film transistor element of the present invention.
Figure 3B:
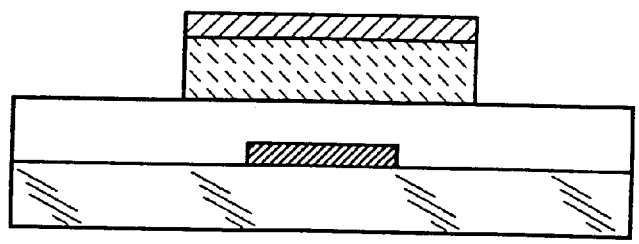
Figure 3C:
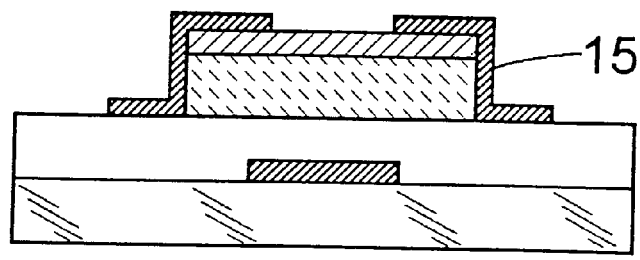
Figure 3D:
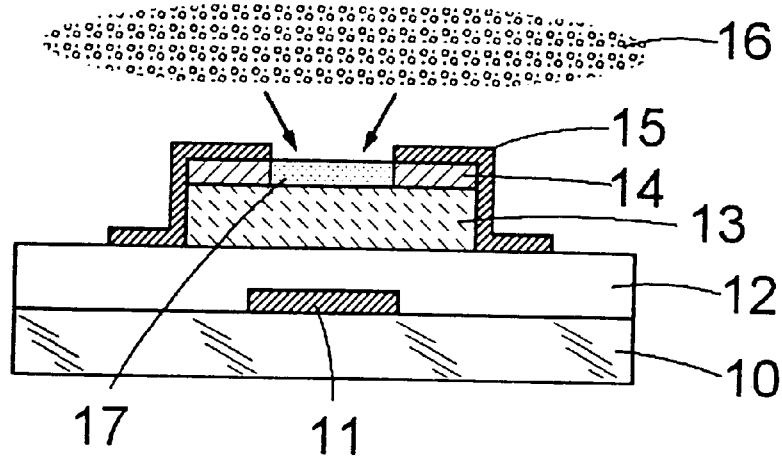

In the above-described embodiment, insulating film 17 and amorphous silicon film 13 are patterned in the last step. However, according to a second embodiment of the present invention, it is also possible to pattern amorphous silicon film 13 and n-doped amorphous silicon film 14 into an island-like shape in advance and then modify n-doped amorphous silicon film 14 into an insulating film. Specifically, as illustrated in FIG. 3A, a metal for use as a gate electrode is first deposited on a transparent insulating substrate 10 and then patterned into a desired shape to form a gate electrode 11. Thereafter, according to a plasma CVD process or the like, a gate insulating film 12, an amorphous silicon film 13 and an n-doped amorphous silicon film 14 are successively formed. Subsequently, as illustrated in FIG. 3B, amorphous silicon film 13 and n-doped amorphous silicon film 14 are patterned into a desired island-like shape. Then, as illustrated in FIG. 3C, a metal for use as source-drain electrodes is deposited by sputtering or the like, and then patterned into desired shapes to form source-drain electrodes 15. In order to prevent the resulting island-like n-doped amorphous silicon film 14 from being laterally oxidized, nitrided, or oxidized and nitrided in the following plasma treatment step, source-drain electrodes 15 are formed so as to cover lateral faces of n-doped amorphous silicon film 14 as illustrated in FIG. 3C. Finally, as illustrated in FIG. 3D, this substrate is subjected to a plasma treatment. Thus, n-doped amorphous silicon film 14 present on amorphous silicon film 13 in the region where amorphous silicon film 13 does not overlap with source-drain electrodes 15 is selectively oxidized, nitrided, or oxidized and nitrided, and thereby modified into an insulating film 17 comprising silicon oxide, silicon nitride or silicon oxide nitride containing an n-type impurity. As a result, a thin-film transistor element is completed.

Although useful n-type impurities include phosphorus (P), arsenic (As) and antimony (Sb), phosphorus is preferably used in the present invention.

As described above, insulating film 17 formed by modification based on a plasma treatment may readily be removed with the aid of a solution containing hydrofluoric acid (e.g., a buffered hydrofluoric acid solution). Thin-film transistor elements having a structure in which the insulating film formed by modification is removed are also within the scope of the present invention. Now, several methods of making a thin-film transistor element which include the step of removing the insulating film formed by modification are described below.

FIG. 4 includes sectional views illustrating a series of steps in one exemplary method of making a thin-film transistor element which includes the step of removing the insulating film formed by modification. In this figure, FIGS. 4A–4C are the same as FIGS. 2A–2C and the explanation thereof is omitted. Insulating film 17 formed by the modification of n-doped amorphous silicon film 14 present on amorphous silicon film 13 in the regions where amorphous silicon film 13 does not overlap with source-drain electrodes 15 can be selectively removed by a common wet etching method which comprises, for example, soaking the substrate in a buffered hydrofluoric acid solution or spraying the substrate with a buffered hydrofluoric acid solution (FIG. 4D). Amorphous silicon film 13 lying under insulating film 17 is not etched with a buffered hydrofluoric acid solution. Finally, amorphous silicon film 13 is patterned into a desired island-like shape. Thus, a thin-film transistor element in accordance with the present invention is completed as illustrated in FIG. 4E.

FIG. 5 includes sectional views illustrating a series of steps in another exemplary method of making a thin-film transistor element which includes the step of removing the insulating film formed by modification. In this figure, FIGS.

Figure 5A:
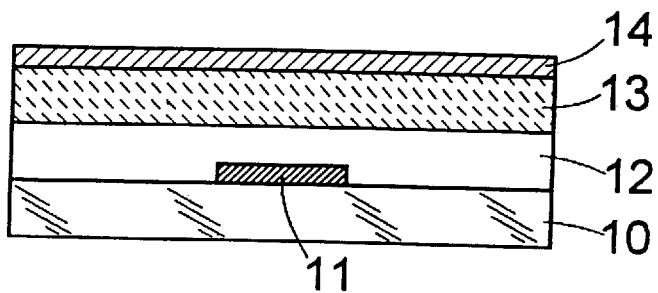
FIGS. 5A to 5E are schematic sectional views for explaining a series of steps in a further form of the method of making the thin-film transistor element of the present invention.
Figure 5B:
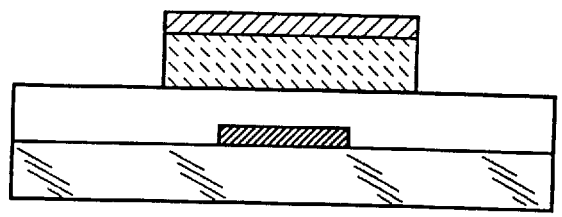
Figure 5C:
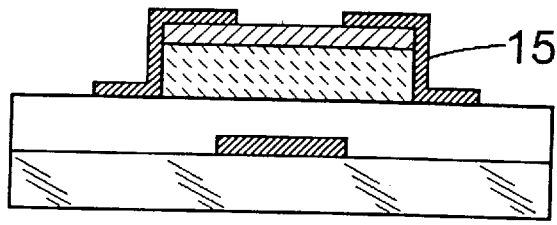
Figure 5D:
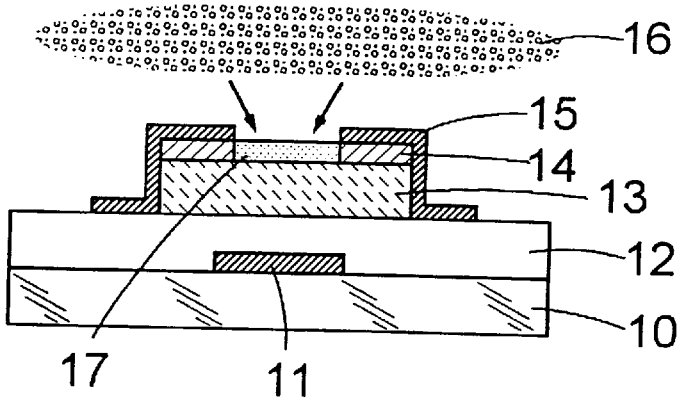
Figure 5E:
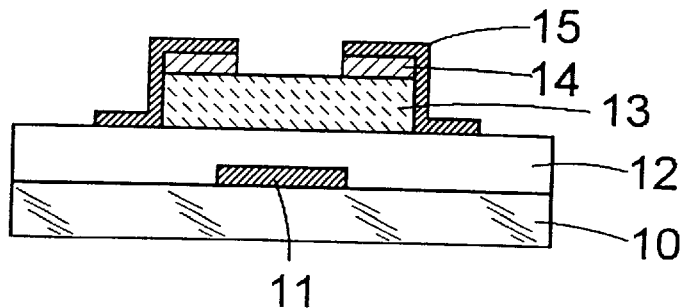

5A–5D are the same as FIGS. 3A–3D and the explanation thereof is omitted. Insulating film 17 formed by the modification of n-doped amorphous silicon film 14 present on amorphous silicon film 13 in the region where amorphous silicon film 13 does not overlap.with source-drain electrodes 15 can be selectively removed by soaking the substrate in a buffered hydrofluoric acid solution or spraying the substrate with a buffered hydrofluoric acid solution. Thus, a thin-film transistor element in accordance with the present invention is completed as illustrated in FIG. 5E.

As described above, thin-film transistor elements having a structure in which a part of n-doped amorphous silicon film 14 present on amorphous silicon film 13 in the regions where amorphous silicon film 13 does not overlap with source-drain electrodes 15 is etched in the direction of the thickness and the remaining n-doped amorphous silicon film 14 is modified into insulating film 17 by a plasma treatment are also within the scope of the present invention. In this case, the thickness of n-doped amorphous silicon film 14 may be increased to about 50–100 nm, so that better ohmic contact characteristics can readily be obtained. Now, several methods of making a thin-film transistor element which include the step of etching, in the direction of the thickness, a part of n-doped amorphous silicon film 14 present on amorphous silicon film 13 in the region(s) where amorphous silicon film 13 does not overlap with source-drain electrodes 15 are described below.

A fifth embodiment of the present invention is specifically described below with reference to FIGS. 6A to 6E.

Figure 6A:
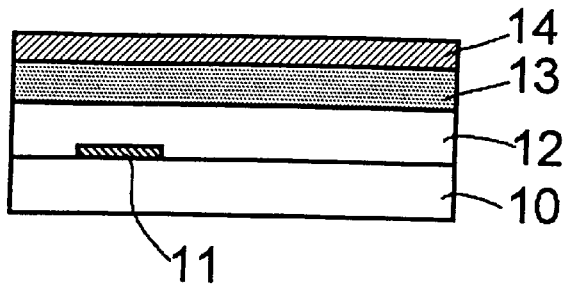
FIGS. 6A to 6E are schematic sectional views for explaining a series of steps in a still further form of the method of making the thin-film transistor element of the present invention.
Figure 6B:
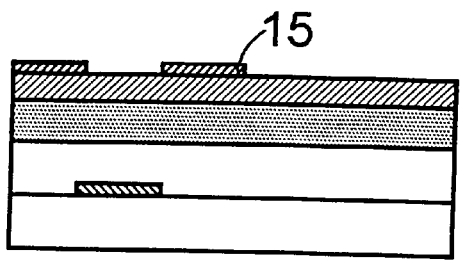
Figure 6C:
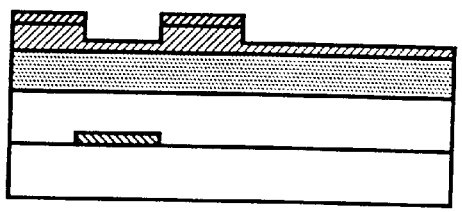
Figure 6D:
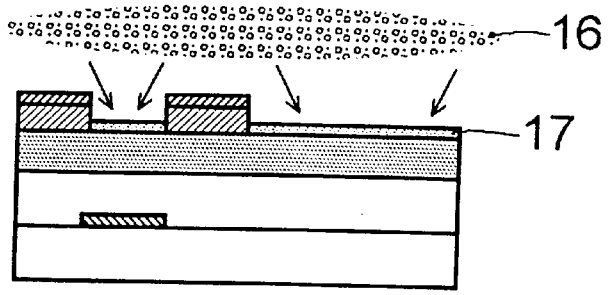
Figure 6E:
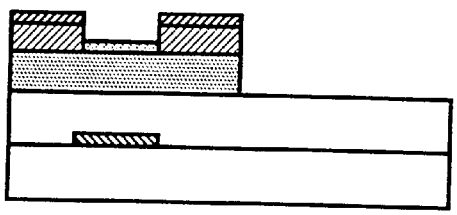

As illustrated in FIG. 6A, a metal for use as a gate electrode is deposited on a transparent insulating substrate 10 and-then patterned into a desired shape to form a gate electrode 11. Thereafter, according to a plasma CVD process or the like, a gate insulating film 12, an amorphous silicon film 13 and an n-doped amorphous silicon film 14 are successively formed. Subsequently, as illustrated in FIG. 6B, a metal for use as source-drain electrodes is deposited by sputtering or the like, and then patterned into the desired shapes of source-drain electrodes 15. Thereafter, using a dry etching or wet etching process, a part of the undesired n-doped amorphous silicon film 14 present in the regions where amorphous silicon film 13 does not overlap with source-drain electrodes 15 is uniformly etched in the direction of the thickness, as illustrated in FIG. 6C. Moreover, as illustrated in FIG. 6D, this substrate is exposed to an atmosphere of an oxygen and/or nitrogen plasma 16. In this step, n-doped amorphous silicon film 14 remaining in the regions where amorphous silicon film 13 does not overlap with source-drain electrodes 15 is modified into an insulating film 17 comprising an oxide film, nitride film or oxide nitride film. In order to modify all the remaining n-doped amorphous silicon film 14 into an oxide film, nitride film or oxide nitride film, it is preferable to limit the thickness of the remaining n-doped amorphous silicon film 14 to about 15 nm or less. Finally, as illustrated in FIG. 6E, this insulating film 17 and amorphous silicon film 13 are patterned into a desired island-like shape to complete a thin-film transistor element in accordance with the present invention.

A sixth embodiment of the present invention is specifically described below with reference to FIGS. 7A to 7F.

Figure 7A:
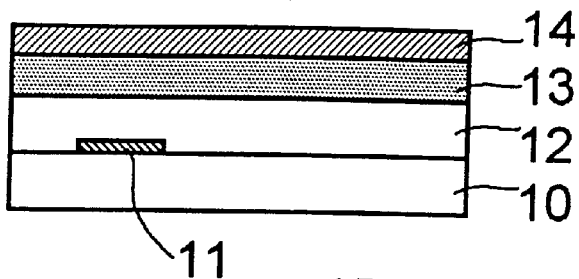
FIGS. 7A to 7F are schematic sectional views for explaining a series of steps in a still further form of the method of making the thin-film transistor element of the present invention.
Figure 7B:
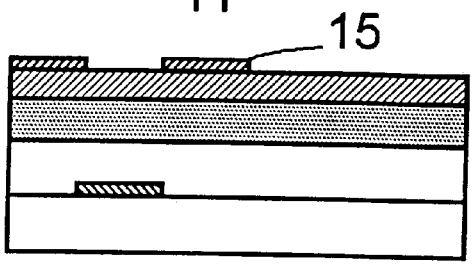
Figure 7C:
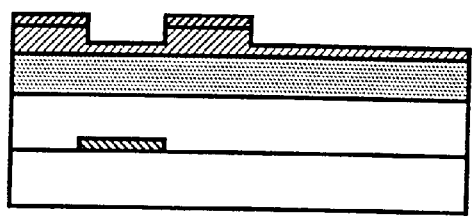
Figure 7D:
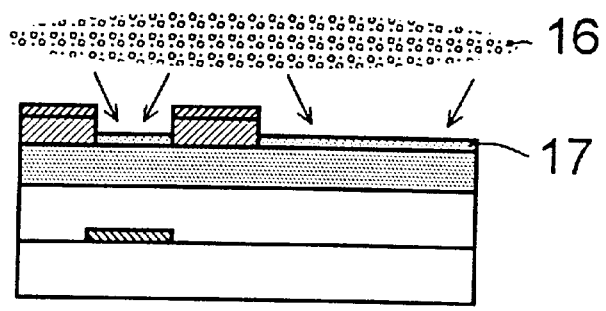
Figure 7E:
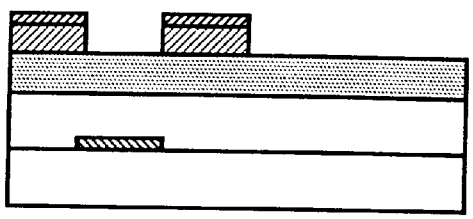
Figure 7F:
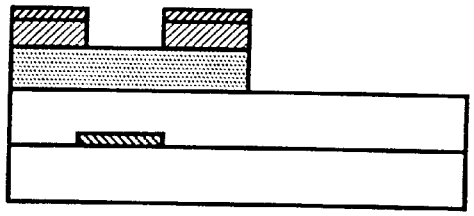

FIGS. 7A to 7D are the same as FIGS. 6A to 6D and the explanation thereof is omitted. Subsequently, as illustrated in FIG. 7E, insulating film 17 is etched by exposing the substrate to a solution containing hydrofluoric acid. Finally, as illustrated in FIG. 7F, amorphous silicon film 13 is patterned into a desired island-like shape to complete a thin-film transistor element in accordance with the present invention.

A seventh embodiment of the present invention is specifically described below with reference to FIGS. 8A to 8E.

Figure 8A:
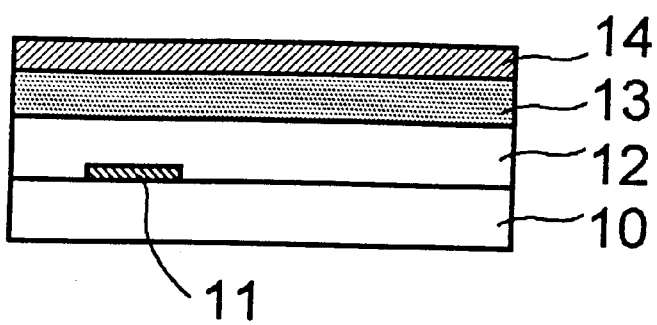
FIGS. 8A to 8E are schematic sectional views for explaining a series of steps in a still further form of the method of making the thin-film transistor element of the present invention.
Figure 8B:
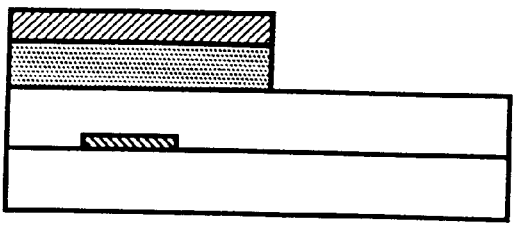
Figure 8C:
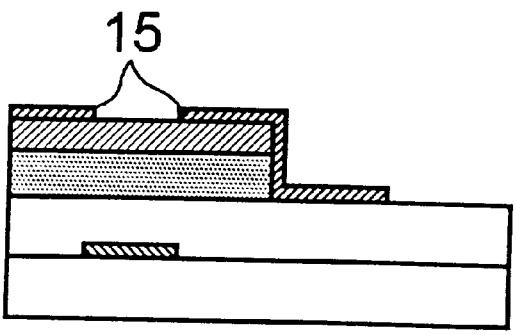
Figure 8D:
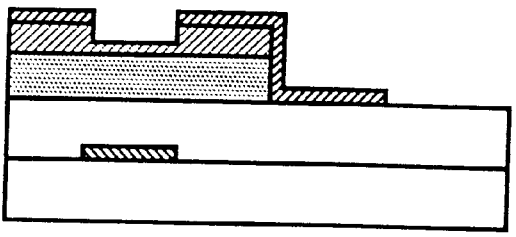
Figure 8E:
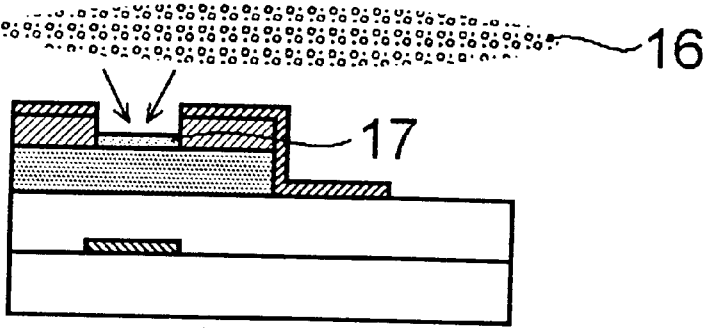

As illustrated in FIG. 8A, a metal for use as a gate electrode is deposited on a transparent insulating substrate 10 and then patterned into a desired shape to form a gate electrode 11. Thereafter, according to a plasma CVD process or the like, a gate insulating film 12, an amorphous silicon film 13 and an n-doped amorphous silicon film 14 are successively formed. Subsequently, as illustrated in FIG. 8B, amorphous silicon film 13 and n-doped amorphous silicon film 14 are patterned into a desired island-like shape. Then, as illustrated in FIG. 8C, a metal for use as source-drain electrodes is deposited by sputtering or the like, and then patterned into desired shapes to form source-drain electrodes 15. In order to prevent the resulting island-like n-doped amorphous silicon film 14 from being laterally oxidized, nitrided, or oxidized and nitrided in the following plasma treatment step, source-drain electrodes 15 are formed so as to cover lateral faces of n-doped amorphous silicon film 14 as illustrated in FIG. 8C. Thereafter, using a dry etching or wet etching process, a part of the undesired n-doped amorphous silicon film 14 present in the regions where amorphous silicon film 13 does not overlap with source-drain electrodes 15 is uniformly etched in the direction of the thickness, as illustrated in FIG. 8D. Moreover, as illustrated in FIG. 8E, this substrate is exposed to an atmosphere of an oxygen and/or nitrogen plasma 16. In this step, n-doped amorphous silicon film 14 remaining in the region where amorphous silicon film 13 does not overlap with source-drain electrodes 15 is modified into an insulating film 17 comprising an oxide film, nitride film or oxide nitride film. In order to modify all the remaining n-doped amorphous silicon film 14 into an oxide film, nitride film or oxide nitride film, it is preferable to limit the thickness of the remaining n-doped amorphous silicon film 14 to about 15 nm or less. As a result of the foregoing steps, a thin-film transistor element in accordance with the present invention is completed.

Figure 9:
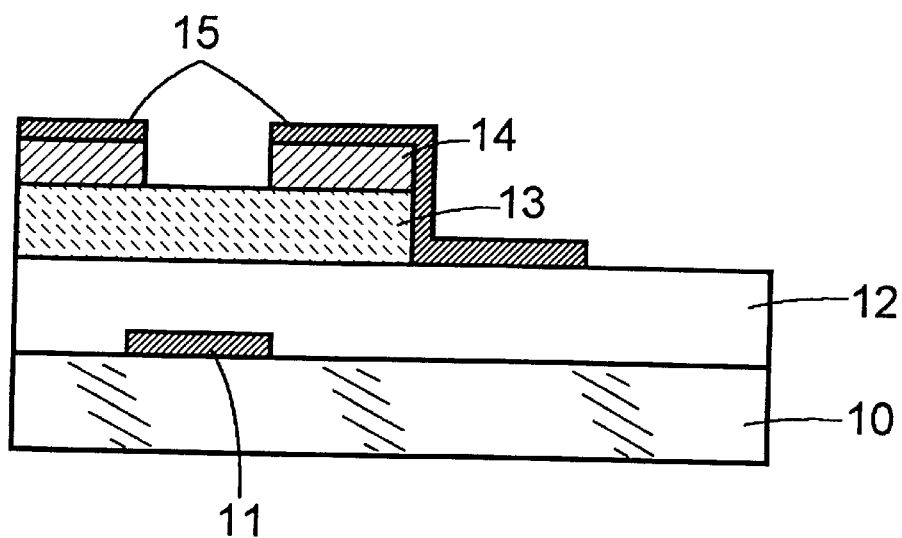
FIG. 9 is a schematic sectional view for explaining another embodiment of the thin-film transistor element of the present invention.

In an eighth embodiment of the present invention, the thin-film transistor element obtained in the foregoing seventh embodiment of the present invention is exposed to a solution containing hydrofluoric acid. Thus, as illustrated in FIG. 9, insulating film 17 is etched to complete a thin-film transistor element in accordance with the present invention.

Next, the feature of the present invention for achieving a high aperture ratio in the above-described thin-film transistor elements is described below.

Figure 11:
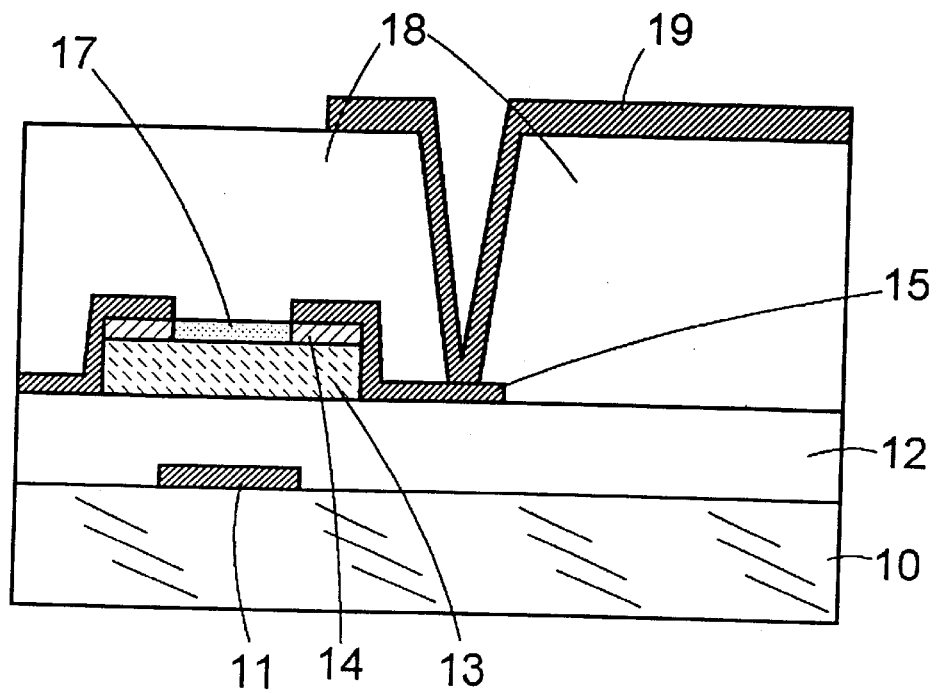
FIG. 11 is a schematic sectional view for explaining another embodiment of the thin-film transistor element for achieving a high aperture ratio in accordance with the present invention.

A ninth embodiment of the present invention is specifically described below with reference to FIGS. 10 and 11. A thin-film transistor element made by subjecting a substrate to the steps illustrated in FIGS. 2A to 2D or FIGS. 3A to 3D is spin-coated with a coating solution for the formation of an insulating film, and then heat-treated to form an.applied insulating film 18. Subsequently a contact hole of a desired shape is made. Thereafter, a transparent conductive picture element electrode 19 is formed to complete a thin-film transistor element in accordance with the present invention as illustrated in FIGS. 10 or 11.

Figure 12:
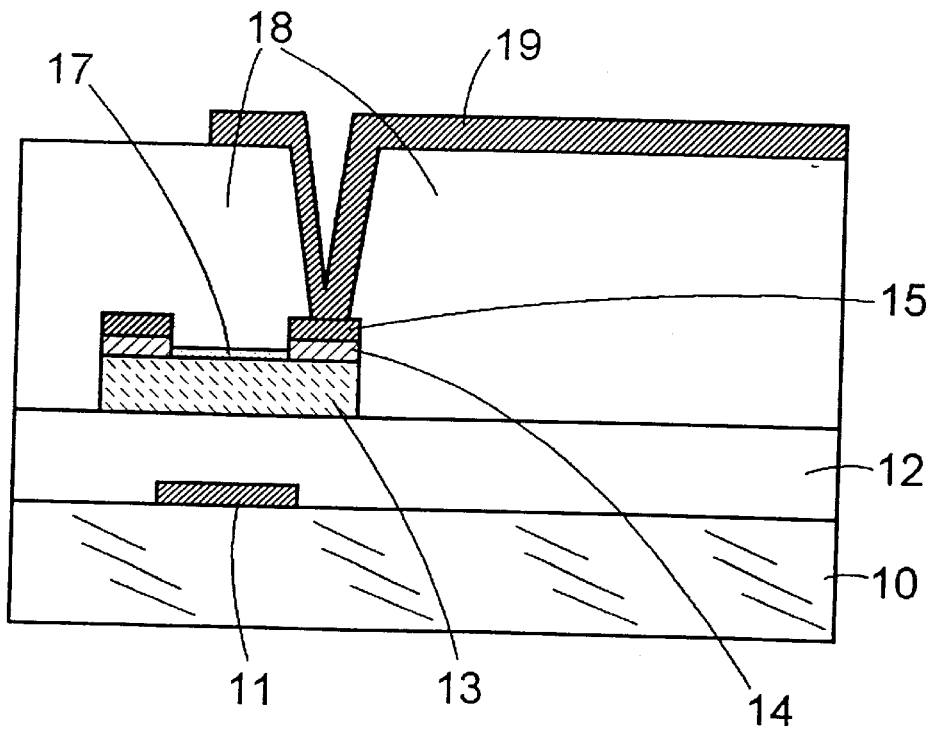
FIG. 12 is a schematic sectional view for explaining still another embodiment of the thin-film transistor element for achieving a high aperture ratio in accordance with the present invention.
Figure 13:
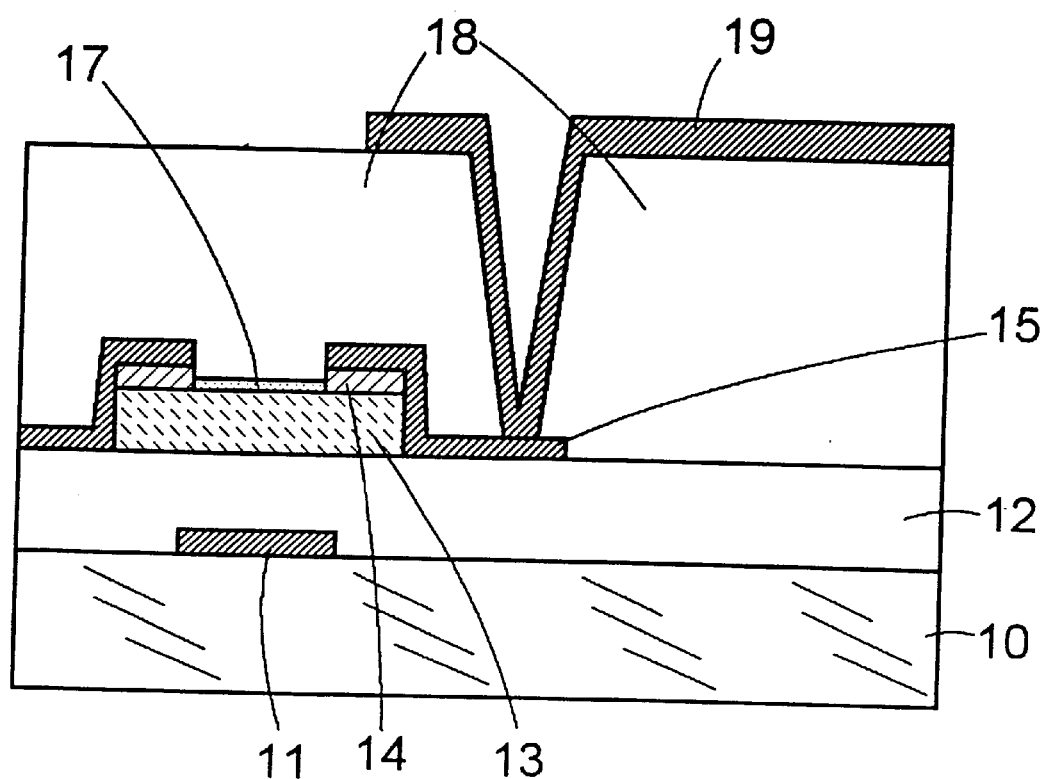
FIG. 13 is a schematic sectional view for explaining a further embodiment of the thin-film transistor element for achieving a high aperture ratio in accordance with the present invention.

A tenth embodiment of the present invention is specifically described below with reference to FIGS. 12 and 13. A thin-film transistor element made by subjecting a substrate to the steps illustrated in FIGS. 6A to 6E or FIGS. 8A to 8E is spin-coated with a coating solution for the formation of an insulating film, and then heat-treated to form an applied insulating film 18. Subsequently, a contact hole of a desired shape is made. Thereafter, a transparent conductive picture element electrode 19 is formed to complete a thin-film transistor element in accordance with the present invention as illustrated in FIGS. 12 or 13.

In these ninth and tenth embodiments, a high-molecular siloxane compound, high-molecular polysilazane compound or the like may be used as the material for the formation of an applied insulating film which serves as a precursor of applied insulating film 18. Specifically, a solution prepared by mixing such a polymeric material with a solvent such as mesitylene or xylene may be uniformly applied to a substrate by spin coating or the like, and then heat-treated at a temperature of about 200–300° C. to form an applied insulating film 18 comprising silicon oxide.

Moreover, a solution prepared by dissolving an acrylic resin, fluororesin, polyimide resin or the like in an organic solvent may also be used as the material for the formation of an applied insulating film which serves as a precursor of applied insulating film 18. Specifically, such a solution may be uniformly applied to a substrate by spin coating or the like, and then heat-treated at a temperature of about 200–300° C. to evaporate the solvent and cure the resin. Thus, there can be formed an applied insulating film 18 comprising the acrylic resin, fluororesin, polyimide resin or the like.

Usually, these applied insulating films have a higher moisture content and a higher mobile ion density than a silicon nitride film formed by a plasma CVD process, so that their adverse influence on thin-film transistor characteristics has been apprehended. In the thin-film transistor elements of the present invention, an insulating film (comprising an oxide, nitride or oxide nitride film) formed by a plasma treatment is present between the applied insulating film and the amorphous silicon film, so that the thin-film transistor characteristics are not adversely affected by moisture and mobile ions contained in the applied insulating film.

The present invention is more specifically explained with reference to the following examples.

EXAMPLE 1

According to the procedure illustrated in FIGS. 2A–2D, a method of making an inverted staggered type thin-film transistor element is described below as one example of the present invention.

First of all, a 100 nm thick chromium film for use as a gate electrode was deposited on a glass substrate 10 serving as a transparent insulating substrate by sputtering, and then patterned into the desired shape of a gate electrode 11 by wet etching. Thereafter, according to a plasma CVD process, a 400 nm thick silicon nitride film 12 serving as a gate insulating film was formed by using a gaseous mixture of silane, ammonia, nitrogen and hydrogen as a raw material, a 50–200 nm thick amorphous silicon film 13 serving as an active layer was formed by using a gaseous mixture of silane and hydrogen as a raw material, and a 7 nm thick n-doped amorphous silicon film 14 was formed by using a gaseous mixture of silane and argon-base 0.5% phosphine as a raw material. In order to form an n-doped amorphous silicon film having high doping efficiency, argon-base 0.5% phosphine was supplied at a flow rate equal to 80 times that of silane. In this case, the flow rate of phosphine was as high as 20% based on the flow rate of silane and the donor level was formed efficiently. The temperature employed for film formation was 300° C. for silicon nitride film 12 and amorphous silicon film 13, and 280° C. for n-doped amorphous silicon film 14. Thus, a structure illustrated in FIG. 2A was completed. Subsequently, a 100 nm thick chromium film for use as source-drain electrodes was deposited by sputtering at a substrate temperature of 150° C., and then patterned into the desired shapes of source-drain electrodes by wet etching. Thus, the procedure was advanced to the step illustrated in FIG. 2B. The substrate having undergone these steps was exposed to an oxygen plasma. The conditions employed for the generation of an oxygen plasma included an oxygen flow rate of 30 sccm, a gas pressure of 60 mTorr, an RF power density of 0.25 Wcm$^{-2}$ and a treating time of 2 minutes. The plasma generator used was a parallel-plate plasma generator, and the substrate was placed on a cathode within a plasma treating apparatus. The self bias voltage used under these conditions was 300–400 V. By exposing the substrate to an oxygen plasma 16 in this manner, n-doped amorphous silicon film 14 present in the regions where amorphous silicon film 13 did not overlap with source-drain electrodes 15 was modified into an insulating oxide film 17. Thus, the procedure was finished up to the step illustrated in FIG. 2C. Thereafter, this oxide film 17 and amorphous silicon film 13 were patterned into a desired island-like shape by dry etching. Thus, a thin-film transistor element as illustrated in FIG. 2D was completed.

Figure 14:
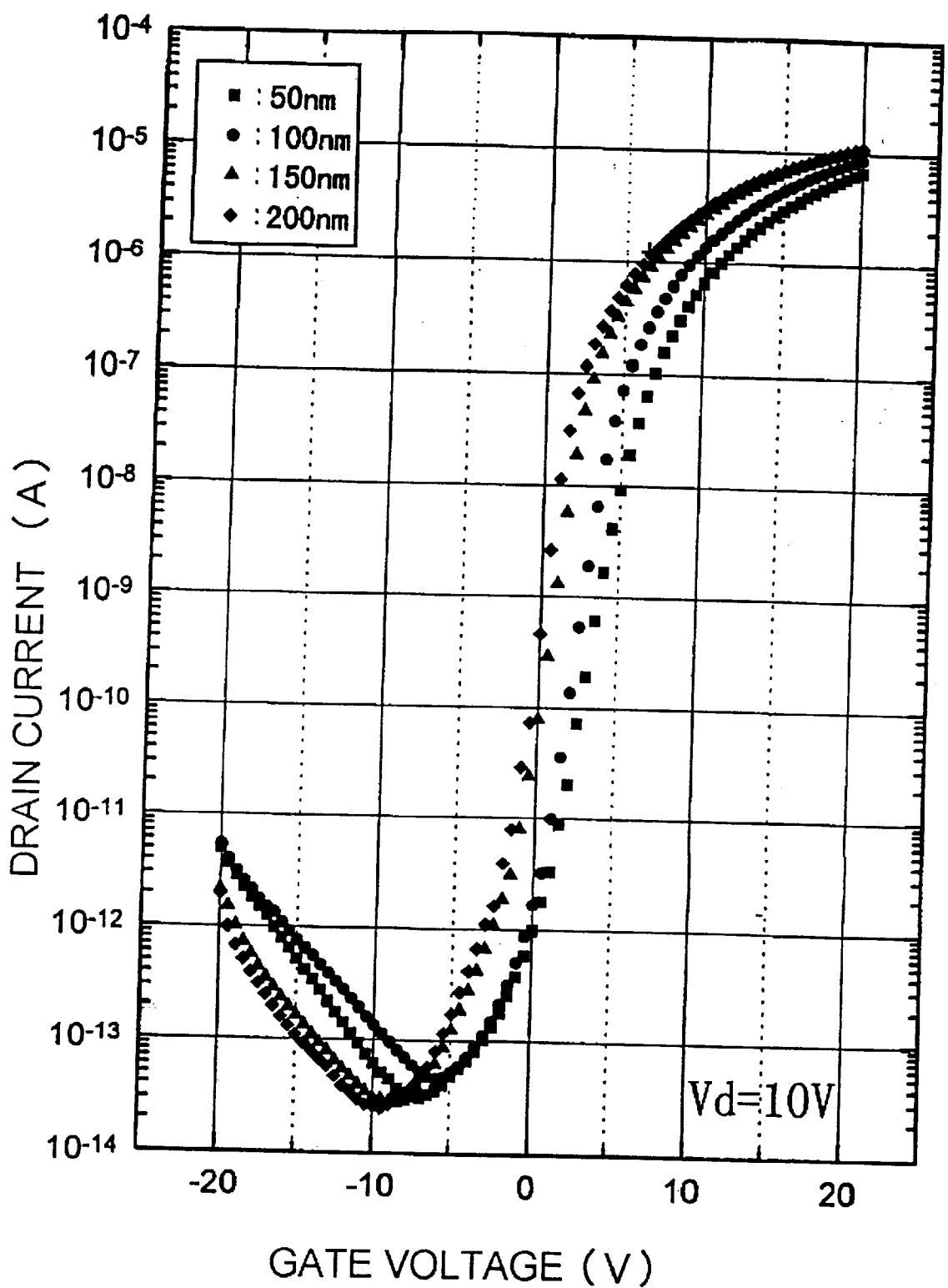
FIG. 14 is a graph showing the gate voltage-drain current characteristics of thin-film transistor elements made in Example 1 and having different amorphous silicon film thickness.

The gate voltage-drain current characteristics of thin-film transistor elements so made according to the present invention are shown in FIG. 14 by using the thickness of the amorphous silicon film as a parameter. As shown in this figure, practical and excellent on-off characteristics were obtained at all film thickness. When the thickness of the amorphous silicon film was decreased from 200 nm to 50 nm, the threshold voltage was slightly raised, but the reduction in on-state current was slight in a sufficient on-state region where the gate voltage was 15 V or above, and involved no problem from a practical point of view. Moreover, the field-effect mobility had a satisfactory value in the range of about 0.6–0.8 cm$^2_V{}^{-1}$sec$^{-1}$.

Thus, since the present invention makes it unnecessary to remove the undesired n-doped amorphous silicon film above the channel by etching, an inverted staggered type thin-film transistor element having a thinner amorphous silicon film can be obtained.

EXAMPLE 2

A second example of the present invention is described below with reference to FIGS. 3A–3D.

First of all, the same procedure as described in Example 1 was repeated till the formation of n-doped amorphous silicon film 14. Thus, there was obtained a structure illustrated in FIG. 3A. In this example, amorphous silicon film 13 was formed to a thickness of 100 nm. Then, amorphous silicon film 13 and n-doped amorphous silicon film 14 were patterned into a desired island-like shape to obtain a structure illustrated in FIG. 3B. Thereafter, a 100 nm thick chromium film for use as source-drain electrodes was deposited by sputtering at a substrate temperature of 150° C., and then patterned into the desired shapes of source-drain electrodes by wet etching. Thus, the substrate having a structure illustrated in FIG. 3C was obtained. Finally, this substrate was exposed to an oxygen plasma. The conditions employed for the generation of an oxygen plasma included an oxygen flow rate of 30 sccm, a gas pressure of 60 mTorr, an RF power density of 0.25 Wcm$^{-2}$ and a treating time of 2 minutes. The plasma generator used was a parallel-plate plasma generator, and the substrate was placed on a cathode within a plasma treating apparatus. Under these conditions, a self bias voltage of 300–400 V was applied. By exposing the substrate to an oxygen plasma in this manner, n-doped amorphous silicon film 14 present in the region where amorphous silicon film 13 did not overlap with source-drain electrodes 15 was modified into an insulating oxide film 17. Thus, a thin-film transistor element as illustrated in FIG. 3D was completed. The thin-film transistor element thus obtained, like those obtained in Example 1, had sufficiently practical and excellent on-off characteristics.

In the foregoing Examples 1 and 2, the plasma treatment comprises a treatment with an oxygen plasma. In the present invention, however, thin-film transistor elements having similarly excellent on-off characteristics can also be obtained by using a nitrogen plasma treatment. The conditions which may be employed for the generation of an oxygen plasma include, for example, a nitrogen flow rate of 50 sccm, a gas pressure of 60 mTorr, an RF power density of 0.3 Wcm$^{-2}$ and a self bias voltage of 200–300 V. Under these conditions, the n-doped amorphous silicon film present on the amorphous silicon film in the region(s) where the amorphous silicon film does not overlap with the source-drain electrodes may be modified into an insulating nitride film, so that practical thin-film transistor characteristics can be obtained. Moreover, a similar effect can also be achieved by a plasma treatment using a gaseous mixture of oxygen and nitrogen.

EXAMPLE 3

Figure 4A:
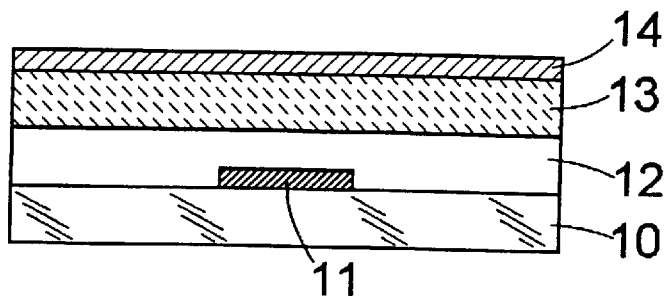
FIGS. 4A to 4E are schematic sectional views for explaining a series of steps in still another form of the method of making the thin-film transistor element of the present invention.
Figure 4B:
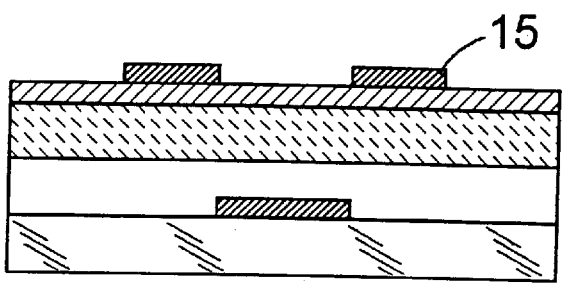
Figure 4C:
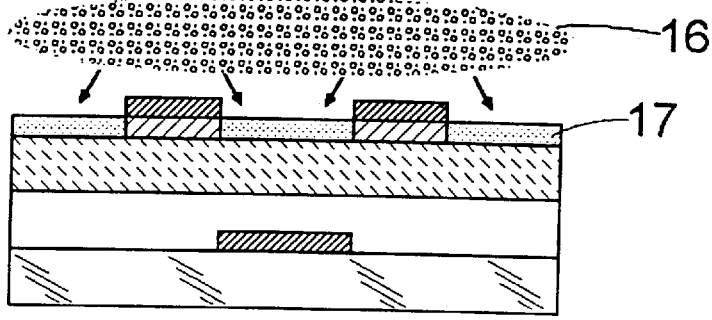
Figure 4D:
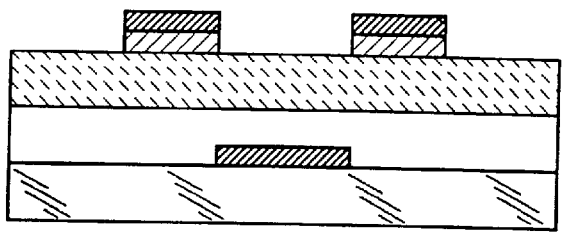

According to the procedure illustrated in FIGS. 4A–AE, a method of making an inverted staggered type thin-film transistor.element in which insulating film 17 formed by modification is removed from the inverted staggered type thin-film transistor element made in Example 1 is described below as another example of the present invention.

Figure 4E:
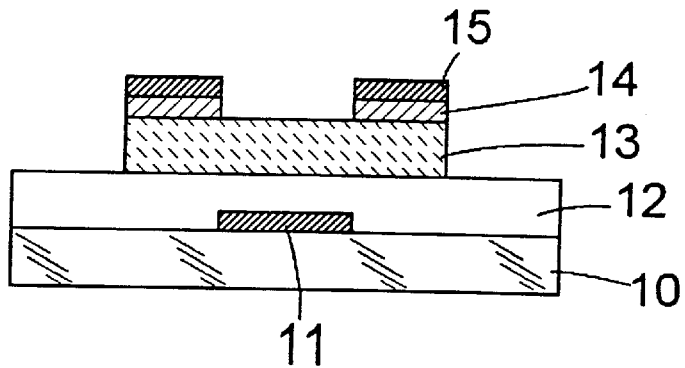

First of all, a 100 nm thick chromium film for use as a gate electrode was deposited on a glass substrate 10 serving as a transparent insulating substrate by sputtering, and then patterned into the desired shape of a gate electrode 11 by wet etching. Thereafter, according to a plasma CVD process, a 400 nm thick silicon nitride film 12 serving as a gate insulating film was formed by using a gaseous mixture of silane, ammonia, nitrogen and hydrogen as a raw material, a 100 nm thick amorphous silicon film 13 serving as an active layer was formed by using a gaseous mixture of silane and hydrogen as a raw material, and a 7 nm thick n-doped amorphous silicon film 14 was formed by using a gaseous mixture of silane and argon-base 0.5% phosphine as a raw material. The temperature employed for film formation was 300° C. for silicon nitride film 12 and amorphous silicon film 13, and 280° C. for n-doped amorphous silicon film 14. Thus, a structure illustrated in FIG. 4A was completed. Subsequently, a 100 nm thick chromium film for use as source-drain electrodes was deposited by sputtering at a substrate temperature of 150° C., and then patterned into the desired shapes of source-drain electrodes by wet etching. Thus, the procedure was advanced to the step illustrated in FIG. 4B. The substrate having undergone these steps was exposed to an oxygen plasma. The conditions employed for the generation of an oxygen plasma included an oxygen flow rate of 30 sccm, a gas pressure of 60 mTorr, an RF power density of 0.25 W cm$^{-2}$ and a treating time of 2 minutes. The plasma generator used was a parallel-plate plasma generator, and the substrate was placed on a cathode within a plasma treating apparatus. Under these conditions, a self bias voltage of 300–400 V was applied. By exposing the substrate to an oxygen plasma in this manner, n-doped amorphous silicon film 14 present in the regions where amorphous silicon film 13 did not overlap with source-drain electrodes 15 was modified into an insulating oxide film 17. Thus, the procedure was finished up to the step illustrated in FIG. 4C. Moreover, this substrate was soaked in a mixture of 16-buffered hydrofluoric acid and water in a volume ratio of 1:6, so that only oxide film 17 was selectively etched to obtain a structure illustrated in FIG. 7D. Finally, amorphous silicon film 13 was patterned into a desired island-like shape by dry etching. Thus, a thin-film transistor element as illustrated in FIG. 4E was completed. The thin-film transistor element thus obtained, like those obtained in Example 1, had sufficiently practical and excellent on-off characteristics.

EXAMPLE 4

According to the procedure illustrated in FIGS. 5A–5E, a method of making an inverted staggered type thin-film transistor element in which insulating film 17 formed by modification is removed from the inverted staggered type thin-film transistor element made in Example 2 is described below as still another example of the present invention.

First of all, a 100 nm thick chromium film for use as a gate electrode was deposited on a glass substrate 10 serving as a transparent insulating substrate by sputtering, and then patterned into the desired shape of a gate electrode 11 by wet etching. Thereafter, according to a plasma CVD process, a 400 nm thick silicon nitride film 12 serving as a gate insulating film was formed by using a gaseous mixture of silane, ammonia, nitrogen and hydrogen as a raw material, a 100 nm thick amorphous silicon film 13 serving as an active layer was formed by using a gaseous mixture of silane and hydrogen as a raw material, and a 7 nm thick n-doped amorphous silicon film 14 was formed by using a gaseous mixture of silane and argon-base 0.5% phosphine as a raw material. The temperature employed for film formation was 300° C. for silicon nitride film 12 and amorphous silicon film 13, and 280° C. for n-doped amorphous silicon film 14. Thus, a structure illustrated in FIG. 5A was completed. Then, amorphous silicon film 13 and n-doped amorphous silicon film 14 were patterned into a desired island-like shape to obtain a structure illustrated in FIG. 5B. Thereafter, a 100 nm thick chromium film for use as source-drain electrodes was deposited by sputtering at a substrate temperature of 150° C., and then patterned into the desired shapes of source-drain electrodes by wet etching. Thus, the substrate having a structure illustrated in FIG. 5C was obtained. The substrate having undergone these steps was exposed to an oxygen plasma. The conditions employed for the generation of an oxygen plasma included an oxygen flow rate of 30 sccm, a gas pressure of 60 mTorr, an RF power density of 0.25 Wcm$^{-2}$ and a treating time of 2 minutes. The plasma generator used was a parallel-plate plasma generator, and the substrate was placed on a cathode within a plasma treating apparatus. Under these conditions, a self bias voltage of 300–400 V was applied. By exposing the substrate to an oxygen plasma in this manner, n-doped amorphous silicon film 14 present in the region where amorphous silicon film 13 did not overlap with source-drain electrodes 15 was modified into an insulating oxide film 17. Thus, the procedure was finished up to the step illustrated in FIG. 5D. Moreover, this substrate was soaked in a mixture of 16-buffered hydrofluoric acid and water in a volume ratio of 1:6, so that only oxide film 17 was selectively etched. Thus, a thin-film transistor element as illustrated in FIG. 5E was completed. The thin-film transistor element thus obtained, like those obtained in Example 1, had sufficiently practical and excellent on-off characteristics.

Also in the foregoing Example 3 and 4, thin-film transistor elements having a similar structure can be made by carrying out a nitrogen plasma treatment in place of the oxygen plasma treatment to modify the n-doped amorphous silicon film into an insulating nitride film and then removing the nitride film with the aid of a solution containing hydrofluoric acid.

EXAMPLE 5

According to the procedure illustrated in FIGS. 6A–6E, a method of making an inverted staggered type thin-film transistor element in which a part of the n-doped amorphous silicon film is removed and the remaining n-doped amorphous silicon film is modified into an insulating film 17 by a plasma treatment is described below as a further example of the present invention.

First of all, a 100 nm thick chromium film for use as a gate electrode was deposited on a glass substrate 10 serving as a transparent insulating substrate by sputtering, and then patterned into the desired shape of a gate electrode 11 by wet etching. Thereafter, according to a plasma CVD process, a 400 nm thick silicon nitride film 12 serving as a gate insulating film was formed by using a gaseous mixture of silane, ammonia, nitrogen and hydrogen as a raw material, a 100 nm thick amorphous silicon film 13 serving as an active layer was formed by using a gaseous mixture of silane and hydrogen as a raw material, and a 50 nm thick n-doped amorphous silicon film 14 was formed by using a gaseous mixture of silane and argon-base 0.5% phosphine as a raw material. The temperature employed for film formation was 300° C. for silicon nitride film 12 and amorphous silicon film 13, and 280° C. for n-doped amorphous silicon film 14. Thus, a structure illustrated in FIG. 6A was completed. Subsequently, a 100 nm thick chromium film for use as source-drain electrodes was deposited by sputtering at a substrate temperature of 150° C., and then patterned into the desired shapes of source-drain electrodes 15 by wet etching. Thus, the substrate having a structure illustrated in FIG. 6B was obtained. Thereafter, according to a dry etching process using a chlorine-containing gas or a wet etching process using a mixture of hydrofluoric acid and nitric acid, n-doped amorphous silicon film 14 present in the regions where n-doped amorphous silicon film 14 did not overlap with source-drain electrodes 15 was uniformly etched to a depth of about 40 nm. Consequently, an about 10 nm thick n-doped amorphous silicon film 14 remained over the whole surface, except the regions coated with source-drain electrodes 15. Thus, the procedure was advanced to the step illustrated in FIG. 6C. Moreover, as illustrated in FIG. 6D, this substrate was exposed to an atmosphere of an oxygen or nitrogen plasma 16. The conditions employed for the generation of a plasma included an oxygen or nitrogen flow rate of 30–50 sccm, a gas pressure of 60 mTorr, an RF power density of 0.25–0.30 Wcm$^{-2}$ and a treating time of 2 minutes. The plasma generator used was a parallel-plate plasma generator, and the substrate was placed on a cathode within a plasma treating apparatus. Under these conditions, a self bias voltage of 200–400 V was applied. By exposing the substrate to an atmosphere of an oxygen or nitrogen plasma in this manner, the about 10 nm thick n-doped amorphous silicon film 14 remaining on amorphous silicon film 13 in the regions where amorphous silicon film 13 did not overlap with source-drain electrodes 15 was modified into an insulating oxide or nitride film 17. With consideration for the continuity of the steps of FIGS. 6C and 6D, it is more efficient to employ dry etching in the step of FIG. 6C because the step of FIG. 6D can be carried out in the same chamber. Thus, the procedure was advanced to the step illustrated in FIG. 6D. Finally, as illustrated in FIG. 6E, this insulating film 17 and amorphous silicon film 13 were patterned into a desired island-like shape by dry etching. Thus, a thin-film transistor element in accordance with the present invention was completed. The thin-film transistor element thus obtained, like those obtained in Example 1, exhibited practical and excellent characteristics including an on-off current ratio of at least $10^6$, good ohmic contact characteristics, a field-effect mobility of 0.7 cm$^{-2}$V$^{-1}$sec$^{-1}$, and a threshold voltage of about 1.5 V.

EXAMPLE 6

According to the procedure illustrated in FIGS. 7A–7F, a method of making an inverted staggered type thin-film transistor element in which a part of the n-doped amorphous silicon film is removed, the remaining n-doped amorphous silicon film is modified into an insulating film 17 by a plasma treatment, and the resulting insulating film 17 is finally removed is described below as a further example of the present invention.

The steps illustrated in FIGS. 7A to 7D were carried out in the same manner as described in Example 5 with reference to FIGS. 6A to 6D. Then, this substrate was soaked in a mixture of 16-buffered hydrofluoric acid and water in a volume ratio of 1:6, so that only insulating layer 17 was selectively etched to obtain a structure illustrated in FIG. 7E. Finally, as illustrated in FIG. 7F, amorphous silicon film 13 was patterned into a desired island-like shape by dry etching. Thus, a thin-film transistor element in accordance with the present invention was completed. Alternatively, the element illustrated in FIG. 7F may be obtained by selectively etching only insulating film 17 of the element illustrated in FIG. 6E. The thin-film transistor element thus obtained, like those obtained in Example 1, exhibited practical and excellent characteristics including an on-off current ratio of at least $10^6$, good ohmic contact characteristics, a field-effect mobility of 0.6 cm$^2$V$^{-1}$sec$^{-1}$, and a threshold voltage of about 1.5 V.

EXAMPLE 7

According to the procedure illustrated in FIGS. 8A–8E, a method of making an inverted staggered type thin-film transistor element in which a part of the n-doped amorphous silicon film is removed and the remaining n-doped amorphous silicon film is modified into an insulating film 17 by a plasma treatment is described below as a further example of the present invention.

First of all, a 100 nm thick chromium film for use as a gate electrode was deposited on a glass substrate 10 serving as a transparent insulating substrate by sputtering, and then patterned into the desired shape of a gate electrode 11 by wet etching. Thereafter, according to a plasma CVD process, a 400 nm thick silicon nitride film 12 serving as a gate insulating film was formed by using a gaseous mixture of silane, ammonia, nitrogen and hydrogen as a raw material, a 100 nm thick amorphous silicon film 13 serving as an active layer was formed by using a gaseous mixture of silane and hydrogen as a raw material, and a 50 nm thick n-doped amorphous silicon film 14 was formed by using a gaseous mixture of silane and argon-base 0.5% phosphine as a raw material. The temperature employed for film formation was 300° C. for silicon nitride film 12 and amorphous silicon film 13, and 280° C. for n-doped amorphous silicon film 14. Thus, a structure illustrated in FIG. 8A was completed. Subsequently, as illustrated in FIG. 8B, amorphous silicon film 13 and n-doped amorphous silicon film 14 were patterned into a desired island-like shape by dry etching. Moreover, as illustrated in FIG. 8C, a 100 nm thick chromium film for use as source-drain electrodes was deposited by sputtering at a substrate temperature of 150° C., and then patterned into the desired shapes of source-drain electrodes 15 by wet etching. Thereafter, according to a dry etching process using a chlorine-containing gas or a wet etching process using a mixture of hydrofluoric acid and nitric acid, n-doped amorphous silicon film 14 present in the region where n-doped amorphous silicon film 14 did not overlap with source-drain electrodes 15 was etched to a depth of about 40 nm. Consequently, an about 10 nm thick n-doped amorphous silicon film 14 remained. Thus, the procedure was advanced to the step illustrated in FIG. 8D. Furthermore, as illustrated in FIG. 8E, this substrate was exposed to an atmosphere of an oxygen or nitrogen plasma 16. The conditions employed for the generation of a plasma included an oxygen or nitrogen flow rate of 30–50 sccm, a gas pressure of 60 mTorr, an RF power density of 0.25–0.30 $Wcm^{-2}$ and a treating time of 2 minutes. The plasma generator used was a parallel-plate plasma generator, and the substrate was placed on a cathode within a plasma treating apparatus. Under these conditions, a self bias voltage of 200–400 V was applied. By exposing the substrate to an atmosphere of an oxygen or nitrogen plasma in this manner, the about 10 nm thick n-doped amorphous silicon film 14 remaining on amorphous silicon film 13 in the region where amorphous silicon film 13 did not overlap with source-drain electrodes 15 was modified into an insulating oxide or nitride film 17. With consideration for the continuity of the steps of FIGS. 8D and 8E, it is more efficient to employ dry etching in the step of FIG. 8D because the step of FIG. 8E can be carried out in the same chamber. Thus, the procedure was advanced to the step illustrated in FIG. 8E, and a thin-film transistor element in accordance with the present invention was completed. The thin-film transistor element thus obtained, like those obtained in Example 1, exhibited practical and excellent characteristics including an on-off current ratio of at least $10^6$, good ohmic contact characteristics, a field-effect mobility of 0.7 $cm^2V^{-1}sec^{-1}$, and a threshold voltage of about 1.5 V.

EXAMPLE 8

The substrate obtained in Example 7 was soaked in a mixture of 16-buffered hydrofluoric acid and water in a volume ratio of 1:6, so that only insulating layer 17 was selectively etched. Thus, a thin-film transistor element in accordance with the present invention was completed as illustrated in FIG. 9. The thin-film transistor element thus obtained, like those obtained in Example 1, exhibited practical and excellent characteristics including an on-off current ratio of at least $10^6$, good ohmic contact characteristics, a field-effect mobility of 0.6 $cm^2V^{-1}sec^{-1}$, and a threshold voltage of about 1.5 V.

EXAMPLES 9–12

Next, several examples in which a high aperture ratio is achieved by using some of the thin-film transistor elements obtained in the foregoing examples are described below.

Using each of the thin-film transistor elements obtained in the foregoing Examples 1, 2, 5 and 7, a solution for the formation of an insulating film, i.e., a mesitylene solution of a divinylsiloxane-bis(benzocyclobutene) polymer obtained by the copolymerization of a siloxane compound and benzocyclobutene, was applied thereto by means of a spin coater, and then cured by heat treatment at 250° C. for 1 hour in an atmosphere of nitrogen. Thus, an about 2–3 μm thick applied insulating film 18 comprising silicon oxide was formed over the whole surface of the element, and a contact hole having a desired shape was made therein. The applied insulating film so formed had a transmittance of 95% in the visible light region (in the wavelength range of 400 to 700 nm). Moreover, an about 40–80 nm thick ITO film serving as a transparent conductive picture element electrode 19 was deposited by sputtering, and then patterned into a desired shape. Thus, thin-film transistor elements in accordance with the present invention were completed as illustrated in FIGS. 10–13.

Figure 15:
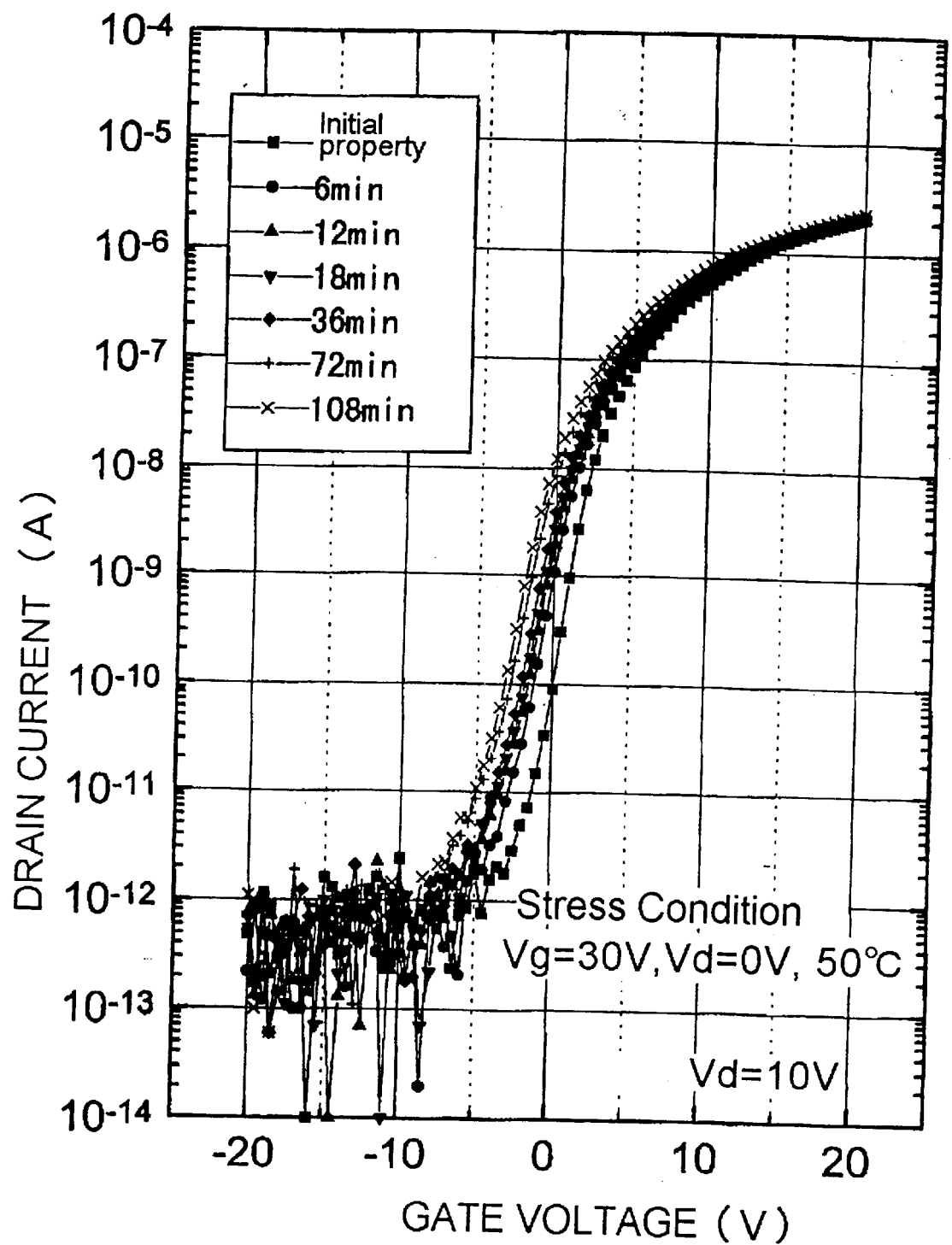
FIG. 15 is a graph showing the initial gate voltage-drain current characteristics of a high-aperture-ratio thin-film transistor element in accordance with the present invention and changes of such characteristics under a negative gate bias stress.
Figure 16:
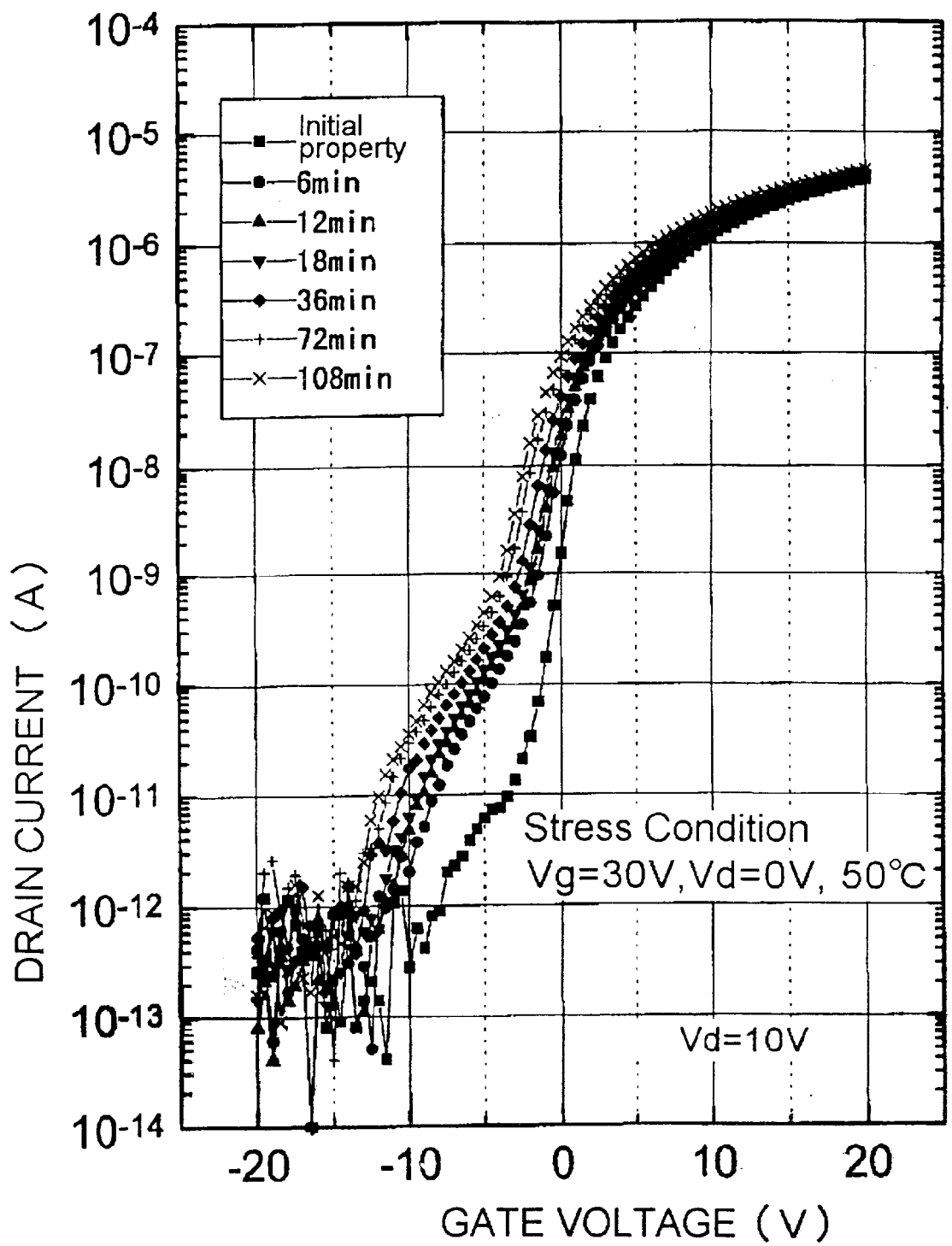
FIG. 16 is a graph showing the initial gate voltage-drain current characteristics of a conventional high-aperture-ratio thin-film transistor element and changes of such characteristics under a negative gate bias stress.
Figure 17:
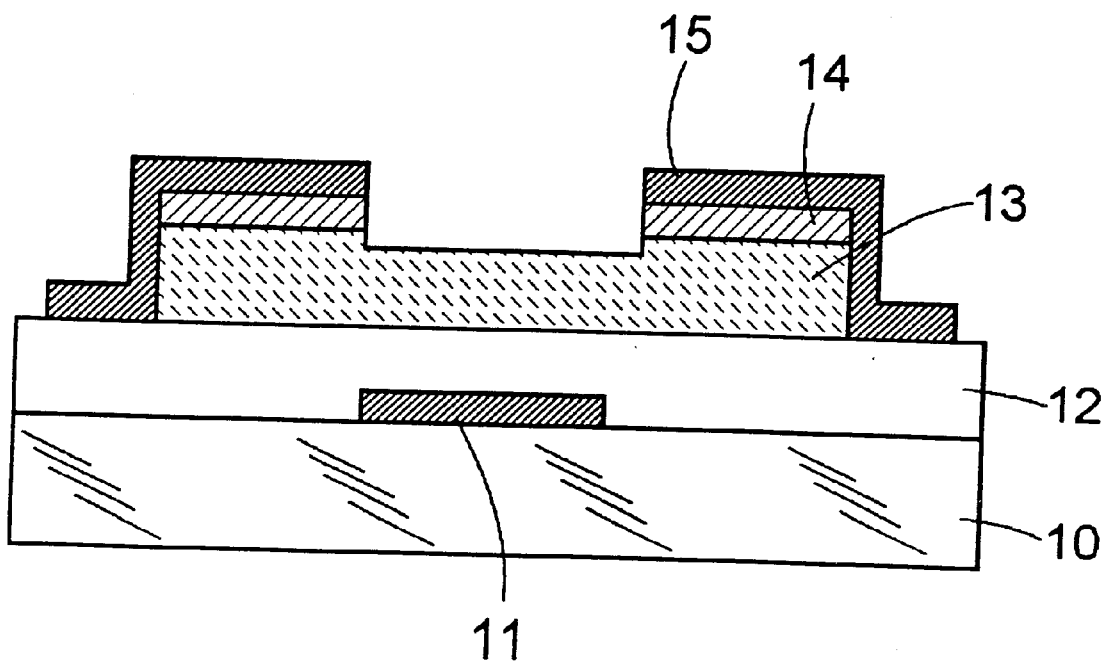
FIG. 17 is a schematic sectional view for explaining the structure of a thin-film transistor element made by the conventional method.
Figure 18:
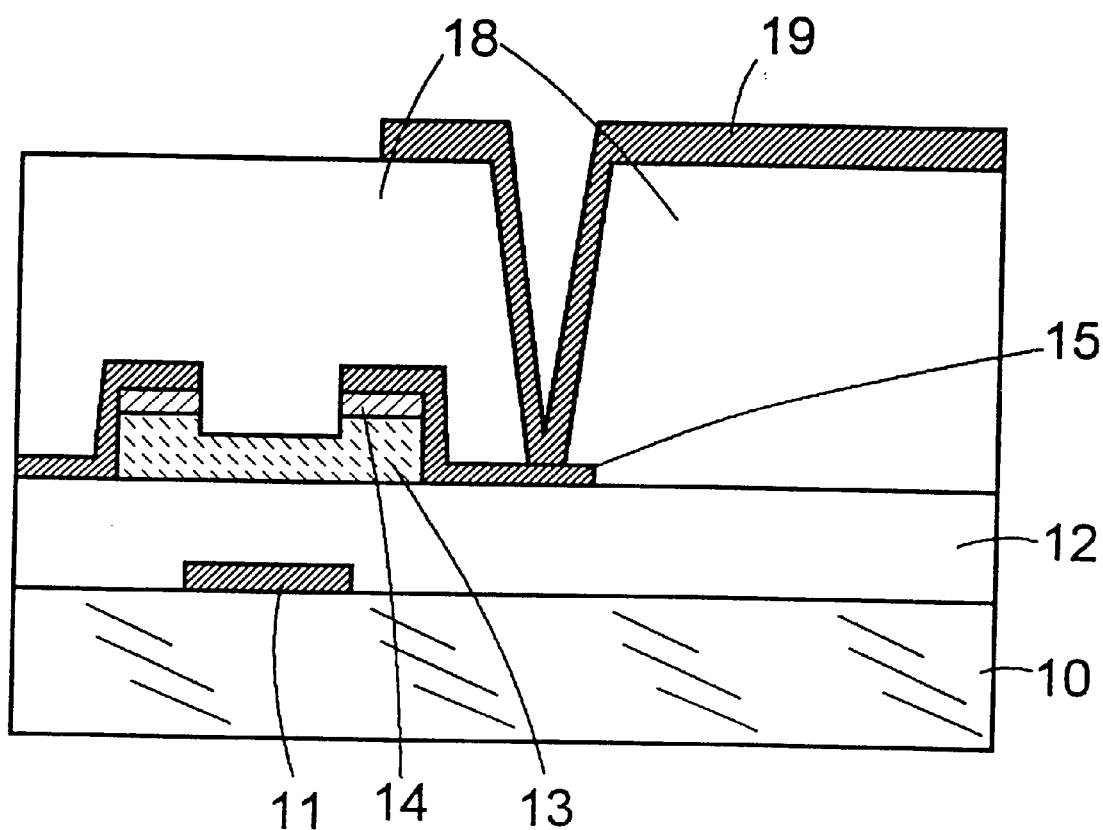
FIG. 18 is a schematic sectional view for explaining the structure of a high-aperture-ratio thin-film transistor element made by the conventional method.

In the above examples, mention is made of the case in which protective insulating film 18 comprising silicon oxide was formed from a high-molecular siloxane compound. With respect to a thin-film transistor element made in this manner, changes of characteristics under a negative gate bias stress are shown in FIG. 15. In the operating state of a liquid crystal displays, the gate electrodes of thin-film transistor elements are negatively biased for a substantial period of time. Accordingly, reliability against negative gate bias stresses is most important. The stress conditions employed include a gate voltage of −30 V, a drain voltage of 0 V, and a temperature of 50° C. For purposes of comparison, FIG. 16 shows changes of characteristics under a negative gate bias stress with respect to a thin-film transistor element of the conventional structure in which the amorphous silicon film and the applied insulating film come into direct contact at the back channel interface (i.e., an insulating film formed by modification based on a plasma treatment is not present at the interface). The stress conditions employed are the same as for FIG. 15. It can be seen from a comparison of these figures that, when subjected to a negative stress, the thin-film transistor element structure of the present invention suppresses the increasing tendency of the off-state current and improves the stability of characteristics as compared with the conventional structure. Alternatively, similar characteristics can also be obtained when a mixture of a siloxane compound and a fluororesin is used to prepare a coating solution for the formation of an insulating film.

A polysilazane compound may also be used to prepare a coating solution for the formation of an insulating film. That is, a solution prepared by dissolving a silazane polymer having a (—Si—N—) backbone in an organic solvent such as xylene may be applied by means of a spin coater and then cured by heat treatment in air at 250° C. for 1 hour. Thus, an about 2–3 μm thick applied insulating film comprising silicon oxide can be formed over the whole surface of the substrate. Thin-film transistor elements using an applied insulating film formed in this manner also exhibit stabilized characteristics similar to those shown in FIG. 15.

In addition, thermosetting resins such as acrylic resins, fluororesins and polyimide resins, or solutions prepared by such a resin in a solvent may also be used as coating solutions for the formation of an insulating film.

For acrylic resins, propylene glycol methyl ether acetate, diethylene glycol methyl ether or the like is used as the solvent. In the same manner as in the foregoing examples, such a solution may be applied by means of a spin coater and then cured by heat treatment in air at 200° C. for 1 hour. Thus, an about 2–3 μm thick applied insulating film comprising an acrylic resin can be formed over the whole surface of the substrate.

For fluororesins, propylene glycol methyl ether acetate, diethylene glycol methyl ether or the like is also used as the solvent. Similarly, such a solution may be applied by means of a spin coater and then cured by heat treatment in air at 250° C. for 1 hour. Thus, an about 2–3 μm thick applied insulating film comprising a fluororesin can be formed over the whole surface of the substrate.

For polyimide resins, N-methyl-2-pyrrolidone or the like is used as the solvent. Similarly, such a solution may be applied by means of a spin coater and then cured by heat treatment in air at 200° C. for 1 hour. Thus, an about 2–3 $\mu$m thick applied insulating film comprising a polyimide resin can be formed over the whole surface of the substrate.

When such organic resins were used, there were also obtained characteristics similar to those shown in FIG. 15. These applied insulating films formed of resins also had a transmittance of not less than 95% in the visible light region, thus exhibiting practical light transmission properties.

Although the plasma generator used in the foregoing examples was a parallel-plate plasma generator, there may be used any type of plasma generator that can generate an oxygen or nitrogen plasma and thereby modify an n-doped amorphous silicon film into an insulating film, for example, including an inductive coupling structure plasma generator or an electrodeless discharge plasma generator using microwaves. Moreover, although oxygen or nitrogen gas was used as the plasma generation gas in the foregoing examples, there may also be used any other gases that can generate a desired oxygen or nitrogen plasma. Such gases include, for example, oxygen compounds such as ozone and nitrous oxide ($N_2O$); nitrogen compounds such as ammonia; and gaseous mixtures obtained by adding a rare gas (e.g., He) to the foregoing gases. Alternatively, a gaseous mixture of oxygen and nitrogen may be used to generate oxygen ions, oxygen radicals, nitrogen ions and nitrogen radicals simultaneously in a plasma and thereby carry out a plasma treatment.

Furthermore, although chromium was used for the gate electrode and the source-drain electrodes in the foregoing examples, there may be used other well-known metals such as molybdenum, aluminum and tungsten, alloys of these metals, and laminated structures of these metals. Thus, the present invention may be applied to any type of electrodes.

Thin-film transistor elements in accordance with the present invention may be made by using, in combination, applied insulating films formed of the above-described various polymeric materials, the above-described various electrode materials, and the above-described methods for modifying an n-doped amorphous silicon film into an insulating film.

While preferred embodiments of the present invention have been described using specific terms, such description is for illustrative purposes only, and it is to be understood that changes and variations may be made without departing from the spirit or scope of the following claims.

What is claimed is:

1. A method of making a thin-film transistor element which comprises at least the steps of:
   (a) successively forming a gate electrode, a gate insulating film, an amorphous silicon film and an n-doped amorphous silicon film on a transparent insulating substrate;
   (b) depositing a metal for use as source-drain electrodes on said n-doped amorphous silicon film and patterning the metal to form source-drain electrodes;
   (c) exposing the substrate having said source-drain electrodes formed thereon to a plasma containing ions or radicals of oxygen and/or nitrogen, and thereby modifying said n-doped amorphous silicon film present in the regions where said amorphous silicon film does not overlap with said source-drain electrodes into an insulating film; and
   (d) patterning said amorphous silicon film into a desired island-like shape.

2. A method of making a thin-film transistor element which comprises at least the steps of:
   (a) successively forming a gate electrode, a gate insulating film, an amorphous silicon film and an n-doped amorphous silicon film on a transparent insulating substrate;
   (b) depositing a metal for use as source-drain electrodes on said n-doped amorphous silicon film and patterning the metal to form source-drain electrodes;
   (c) exposing the substrate having said source-drain electrodes formed thereon to a plasma containing ions or radicals of oxygen and/or nitrogen, and thereby modifying said n-doped amorphous silicon film present in the regions where said amorphous silicon film does not overlap with said source-drain electrodes into an insulating film;
   (d) removing the resulting insulating film by exposure to a solution containing hydrofluoric acid; and
   (e) patterning said amorphous silicon film into a desired island-like shape.

3. A method of making a thin-film transistor element which comprises at least the steps of:
   (a) successively forming a gate electrode, a gate insulating film, an amorphous silicon film and an n-doped amorphous silicon film on a transparent insulating substrate;
   (b) patterning said amorphous silicon film and said n-doped amorphous silicon film into a desired island-like shape;
   (c) depositing a metal for use as source-drain electrodes on the resulting island-like amorphous silicon film and n-doped amorphous silicon film and patterning the metal to form source-drain electrodes; and
   (d) exposing the substrate having said source-drain electrodes formed thereon to a plasma containing ions or radicals of oxygen and/or nitrogen, and thereby modifying said n-doped amorphous silicon film present in the region where said amorphous silicon film does not overlap with said source-drain electrodes into an insulating film.

4. A method as claimed in claim 3 which, subsequent to step (d), includes the additional step (e) of removing the resulting insulating film by exposure to a solution containing hydrofluoric acid.

5. A method of making a thin-film transistor element which comprises at least the steps of:
   (a) successively forming a gate electrode, a gate insulating film, an amorphous silicon film and an n-doped amorphous silicon film on a transparent insulating substrate;
   (b) depositing a metal for use as source-drain electrodes on said n-doped amorphous silicon film and patterning the metal to form source-drain electrodes;
   (c) etching, in the direction of the depth, a part of said n-doped amorphous silicon film present in the regions where said n-doped amorphous silicon film does not overlap with the source-drain electrodes;
   (d) exposing the n-doped amorphous silicon film remaining after the etching step to a plasma containing ions or radicals of oxygen and/or nitrogen, and thereby modifying the remaining n-doped amorphous silicon film into an insulating film; and
   (e) patterning said amorphous silicon film into a desired island-like shape.

6. A method of making a thin-film transistor element which comprises at least the steps of:

(a) successively forming a gate electrode, a gate insulating film, an amorphous silicon film and an n-doped amorphous silicon film on a transparent insulating substrate;

(b) depositing a metal for use as source-drain electrodes on said n-doped amorphous silicon film and patterning the metal to form source-drain electrodes;

(c) etching, in the direction of the depth, a part of said n-doped amorphous silicon film present in the regions where said n-doped amorphous silicon film does not overlap with the source-drain electrodes;

(d) exposing the n-doped amorphous silicon film remaining after the etching step to a plasma containing ions or radicals of oxygen and/or nitrogen, and thereby modifying the remaining n-doped amorphous silicon film into an insulating film;

(e) removing the resulting insulating film by exposure to a solution containing hydrofluoric acid; and (f) patterning said amorphous silicon film into a desired island-like shape.

7. A method of making a thin-film transistor element which comprises at least the steps of:

(a) successively forming a gate electrode, a gate insulating film, an amorphous silicon film and an n-doped amorphous silicon film on a transparent insulating substrate;

(b) patterning said amorphous silicon film and said n-doped amorphous silicon film into a desired island-like shape;

(c) depositing a metal for use as source-drain electrodes on the resulting island-like amorphous silicon film and ndoped amorphous silicon film and patterning the metal to form source-drain electrodes;

(d) etching, in the direction of the depth, a part of said n-doped amorphous silicon film present in the region where said n-doped amorphous silicon film does not overlap with the source-drain electrodes; and (e) exposing the n-doped amorphous silicon film remaining after the etching step to a plasma containing ions or radicals of oxygen and/or nitrogen, and thereby modifying the remaining n-doped amorphous silicon film into an insulating film.

8. A method as claimed in claim 7 which, subsequent to step (e), includes the additional step of (f) removing the resulting insulating film by exposure to a solution containing hydrofluoric acid.

* * * * *